United States Patent
Yanagawa et al.

(10) Patent No.: US 10,504,744 B1
(45) Date of Patent: Dec. 10, 2019

(54) THREE OR MORE STATES FOR ACHIEVING HIGH ASPECT RATIO DIELECTRIC ETCH

(71) Applicant: Lam Research Corporation, Fremont, CA (US)

(72) Inventors: Takumi Yanagawa, Fremont, CA (US); Nikhil Dole, Union City, CA (US); Ranadeep Bhowmick, San Jose, CA (US); Eric Hudson, Berkeley, CA (US); Felix Leib Kozakevich, Sunnyvale, CA (US); John Holland, San Jose, CA (US); Alexei Marakhtanov, Albany, CA (US); Bradford J. Lyndaker, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/040,502

(22) Filed: Jul. 19, 2018

(51) Int. Cl.
| | |
|---|---|
| *H01J 37/32* | (2006.01) |
| *H01L 21/311* | (2006.01) |
| *H01L 21/3065* | (2006.01) |

(52) U.S. Cl.
CPC ...... *H01L 21/31144* (2013.01); *H01J 37/321* (2013.01); *H01J 37/32009* (2013.01); *H01J 37/32082* (2013.01); *H01J 37/32091* (2013.01); *H01J 37/32174* (2013.01); *H01J 37/32183* (2013.01); *H01J 2237/334* (2013.01); *H01L 21/3065* (2013.01)

(58) Field of Classification Search
CPC ............... H01J 37/32091; H01J 37/321; H01J 37/32183; H01J 37/32174; H01J 37/32082; H01J 37/32165; H01J 2237/24564; H01J 37/32458; H01J 37/32532; H01J 37/32577; H01J 37/3444; H01J 2237/334; H01L 21/32136; H01L 31/048; H01L 33/52; H01L 21/31144; H05H 1/46; H05H 2001/4682; H03H 7/40; H03H 11/28; H03H 7/38; H05B 6/6467

See application file for complete search history.

(56) References Cited

U.S. PATENT DOCUMENTS

| | | | |
|---|---|---|---|
| 7,547,636 B2 | 6/2009 | Chi et al. | |
| 8,404,598 B2 | 3/2013 | Liao et al. | |
| 9,583,357 B1 * | 2/2017 | Long | H01L 21/3065 |
| 9,614,524 B1 * | 4/2017 | Kawasaki | H03K 19/0005 |
| 9,620,337 B2 * | 4/2017 | Valcore, Jr. | H01J 37/32917 |

(Continued)

OTHER PUBLICATIONS

Economou, Pulsed plasma etching for semiconductor manufacturing, IOP Publishing, Journal of Physics D: Applied Physics 47 (2014) 303001, p. 1-27.

*Primary Examiner* — Vibol Tan
(74) *Attorney, Agent, or Firm* — Penilla IP, APC

(57) ABSTRACT

Systems and methods for applying three or more states for achieving a high aspect ratio dielectric etch operation are described. In one of the methods, a middle state is introduced between a high state and a low state. The middle state is applied to both a source radio frequency (RF) generator and a bias radio frequency (RF) generator. During the middle state, RF power is maintained to be between a high amount of RF power associated with the high state and a low amount of RF power associated with the low state to achieve the high aspect ratio dielectric etch.

12 Claims, 14 Drawing Sheets

(56) References Cited

U.S. PATENT DOCUMENTS

| | | | |
|---|---|---|---|
| 9,761,459 B2* | 9/2017 | Long | H01L 21/3065 |
| 9,872,373 B1* | 1/2018 | Shimizu | H01J 37/32091 |
| 9,947,514 B2* | 4/2018 | Radomski | H01J 37/32183 |
| 10,224,183 B1* | 3/2019 | Shoeb | H01J 37/32146 |
| 10,225,919 B2* | 3/2019 | Hoffman | H05H 1/46 |
| 10,269,540 B1* | 4/2019 | Carter | H01J 37/32183 |
| 10,304,660 B1* | 5/2019 | Shoeb | H01J 37/32146 |
| 10,304,669 B1* | 5/2019 | Coumou | H01J 37/3299 |
| 10,319,570 B2* | 6/2019 | Valcore, Jr. | H01J 37/32917 |
| 10,347,464 B2* | 7/2019 | Sato | H01J 37/32155 |
| 2010/0213162 A1 | 8/2010 | Mochiki et al. | |

* cited by examiner

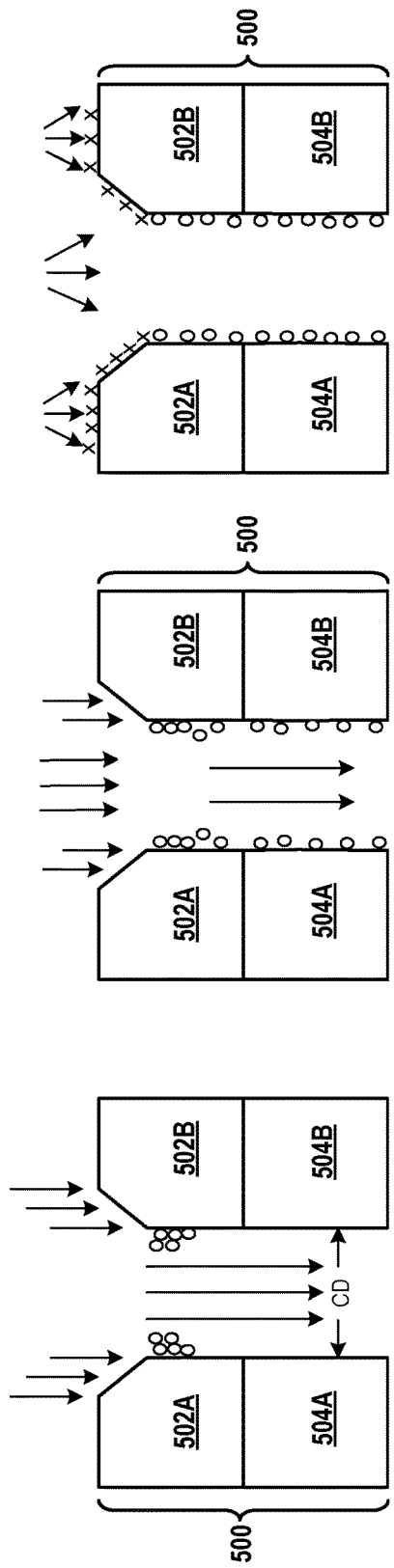

THREE OR MORE STATES FOR ACHIEVING HIGH ASPECT RATIO DIELECTRIC ETCH

FIELD

The present embodiments relate to systems and methods for generating three or more states to achieve a high aspect ratio dielectric etch.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool includes a radio frequency (RF) generator, an impedance match, and a plasma chamber. The RF generator is coupled to the impedance match, which is further coupled to the plasma chamber. A wafer is placed within the plasma chamber.

The RF generator generates an RF signal, which is supplied to the impedance match. The impedance match includes components that reduce power that is reflected towards the RF generator from the plasma chamber. The RF signal passes through the components to change the RF signal. The changed RF signal is provided from the impedance match to the plasma chamber to process the wafer.

It is in this context that embodiments described in the present disclosure arise.

SUMMARY

Embodiments of the disclosure provide systems, apparatus, methods and computer programs for generating three or more states to achieve a high aspect ratio dielectric etch. It should be appreciated that the present embodiments can be implemented in numerous ways, e.g., a process, an apparatus, a system, a device, or a method on a computer readable medium. Several embodiments are described below.

In some embodiments, a method for applying a middle state between a high state and a low state is described. During the middle state, a level of radio frequency (RF) power that is less than that applied during the high state is applied to a substrate. The application of the level of RF power during the middle state increases a critical dimension at a neck of a mask layer of the substrate. Also, a mask material that is deposited on the mask layer during the high state is sputtered towards a substrate layer of the substrate to reduce chance of a bow being created in the substrate layer.

In various embodiments, a method for achieving bow reduction without impacting capping margin and mask selectivity in high aspect ratio (HAR) etch is described. An example of the bow reduction is a bow growth rate reduction with respect to etch depth and an example of the capping margin is neck critical dimension (CD) shrink. The method includes implementing multi-state pulsing with mid-power state RF pulsing during a dielectric etch operation. The method helps minimize lateral etch while maintaining a vertical etch rate without scarifying capping or without clogging at neck below a mask facet area of the mask layer of the substrate. The lateral etch causes the bow in the substrate layer of the substrate. The substrate layer is below the mask layer. The clogging is caused by excessive passivation deposition of mask layer below the mask facet area.

In various embodiments, a method includes applying a state S2 between states S1 and S3 to balance mask redeposition versus neck removal for opening of a critical dimension of the neck. The state S2 is introduced between the states S1 and S3 to sputter passivation, such as a deposition of the mask material, from the neck to the substrate layer to facilitate neutral passivation at a location of the bow. As an example, RF power during the state S2 is between RF power during the state S1 and RF power during the state S3. Also, as an example, a target ion energy during the state S2 ranges from and including 1.0 kilo electron volts (keV) to 5 keV.

In some embodiments, a method for processing a dielectric etch operation in a capacitively coupled plasma (CCP) chamber is described. The CCP chamber has a substrate support electrode and an upper electrode that defines a processing volume. The method includes supplying a bias RF signal to be applied to the substrate support electrode. The bias RF signal is controlled to include a first plurality of parameter levels during a repeating time period. The first plurality of parameter levels include a first parameter level during a first state, a second parameter level during a second state, and a third parameter level during a third state. Moreover, the method includes supplying a source RF signal to be applied to the upper electrode to deliver a second plurality of parameter levels to the upper electrode during the repeating time period. The second plurality of parameter levels include a first parameter level during the first state, a second parameter level during the second state and a third parameter level during the third state. The second parameter level of the bias RF signal during the second state is set to be different from the first parameter level of the bias RF signal during the first state and the third parameter level of the bias RF signal during the third state is set to be different from the first and second parameter levels of the bias RF signal. The second parameter level of the source RF signal during the second state is set to be different from the first parameter level of the source RF signal during the first state and the third parameter level of the source RF signal during the third state is set to be different from the first and second parameter levels of the source RF signal.

In various embodiments, the method described above for processing the dielectric etch operation in the CCP chamber is implemented except that the source and bias RF signals are applied to the substrate support electrode.

In some embodiments, a method for processing a dielectric etch operation in a CCP chamber is described. The CCP chamber has a first electrode and a second electrode is described. The CCP chamber is coupled to an impedance matching circuit. The method includes supplying a bias RF signal to the impedance matching circuit. The bias RF signal includes a first plurality of parameter levels during a repeating time period. The first plurality of parameter levels include a first parameter level during a first state, a second parameter level during a second state, and a third parameter level during a third state. The method further includes supplying a source RF signal to the impedance matching circuit to deliver a second plurality of parameter levels during the repeating time period. The second plurality of parameter levels including a first parameter level during the first state, a second parameter level during the second state and a third parameter level during the third state. The bias RF signal and the source RF signal are used to control the dielectric etch operation in the CCP chamber. The first, second and third parameter levels of the bias RF signal are different from each other. The first, second and third parameter levels of the source RF signal are different from each other.

In several embodiments, a system is described. The system includes a plasma chamber having a first electrode and a second electrode. The system further includes an impedance matching circuit coupled to the plasma chamber and a bias RF generator coupled to the impedance matching circuit. The bias RF generator is configured to supply a bias RF signal to the impedance matching circuit. The bias RF signal includes a first plurality of parameter levels during a repeating time period. The first plurality of parameter levels include a first parameter level during a first state, a second parameter level during a second state, and a third parameter level during a third state. The system further includes a source RF generator coupled to the impedance matching circuit. The source RF generator supplies a source RF signal to the impedance matching circuit. The source RF signal includes a second plurality of parameter levels during the repeating time period. The second plurality of parameter levels include a first parameter level during the first state, a second parameter level during the second state, and a third parameter level during the third state. The first, second and third parameter levels of the bias RF signal are different from each other. The first, second and third parameter levels of the source RF signal are different from each other.

Some advantages of the herein described systems and methods include applying a mid-power level during the state S2 to the substrate. The mid-power level, in one embodiment, is between a high power level for the state S1 and a low power level for the state S3. The mid-power level generates plasma ions that sputter the mask material downward to protect the substrate layer. The mask material may be deposited on the mask layer during the state S1. The mask material that is sputtered protects the substrate layer during the state S1 in which an etch operation is performed. Also, by sputtering the mask material downward, there is an increase in a critical dimension at the neck. The increase in the critical dimension at the neck reduces chances of lateral etch of the substrate layer and increases chances of vertical etch of the substrate layer to increase selectivity and etch rate of etching the substrate. During the state S3, a material is deposited on the mask layer.

Some additional advantages of the herein described systems and methods include an improvement in a tradeoff between an after etch inspection bow CD versus unopen defect, an improvement in a tradeoff between an after development inspection bow CD versus unopen defect, an improvement in a tradeoff between etch selectivity versus unopen defect, and an improvement in an aspect ratio dependent etch (ARDE).

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 5C is an embodiment of the substrate to illustrate an effect of a state S1 of three-state pulsing on the substrate.

FIG. 5D is an embodiment of the substrate to illustrate an effect of a state S2 of the three-state pulsing on the substrate.

FIG. 5E is an embodiment of the substrate to illustrate an effect of a state S3 of the three-state pulsing on the substrate.

DETAILED DESCRIPTION

The following embodiments describe systems and methods for generating three or more states to achieve a high aspect ratio dielectric etch. It will be apparent that the present embodiments may be practiced without some or all of these specific details. In other instances, well known process operations have not been described in detail in order not to unnecessarily obscure the present embodiments.

Figure 1A:
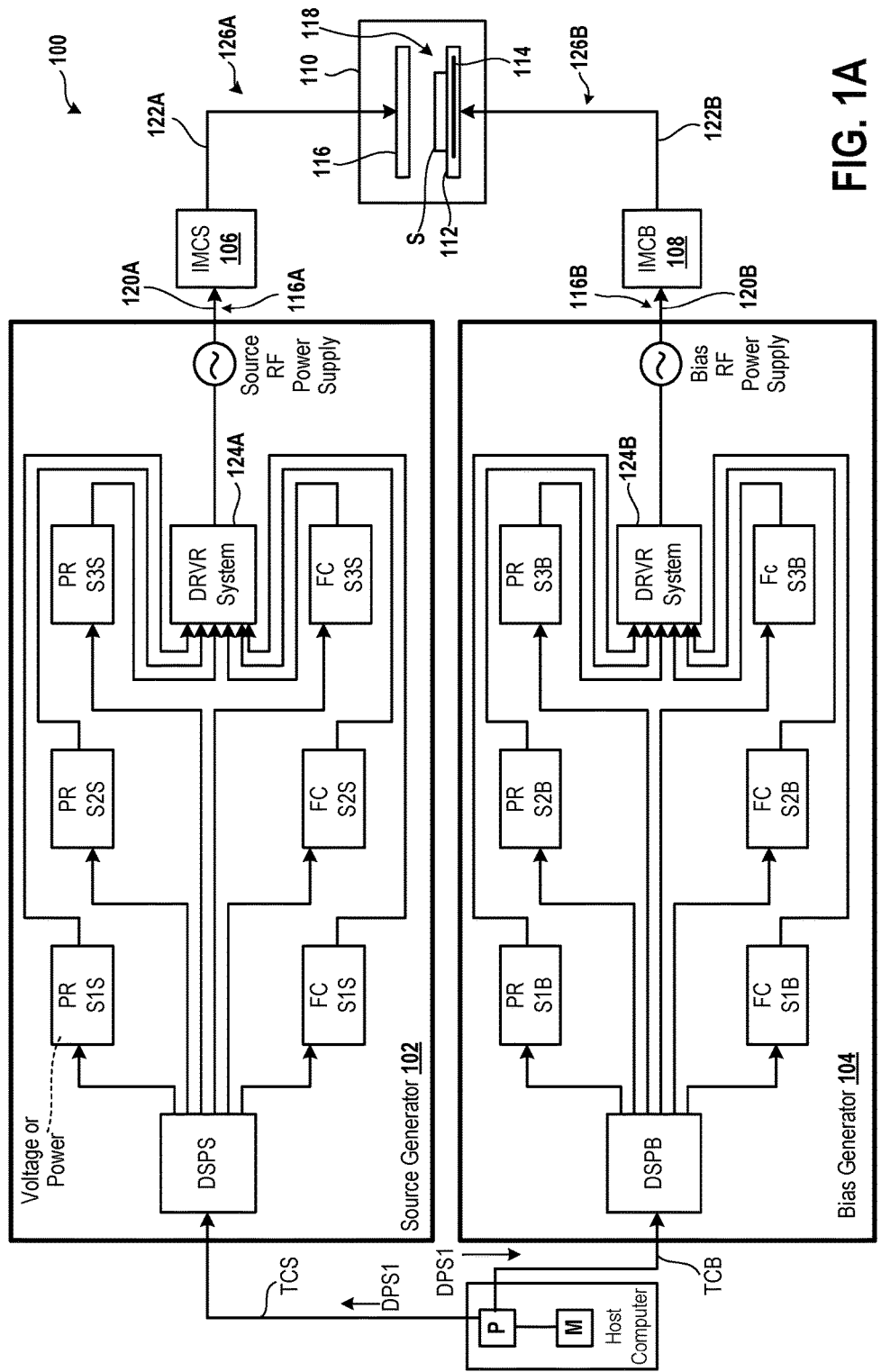
FIG. 1A is a diagram of an embodiment of a system to illustrate generation of three states to achieve a high aspect ratio dielectric etch.

FIG. 1A is a diagram of an embodiment of a system 100 to illustrate generation of three states to achieve a high aspect ratio dielectric etch. The system 100 includes a source generator 102 and a bias generator 104. The source generator 102 is an example of a source RF generator and the bias generator 104 is an example of a bias RF generator. The system 100 further includes an impedance matching circuit (IMCS) 106 for the source generator 102 and another impedance matching circuit (IMCB) 108 for the bias generator 104. The impedance matching circuit IMCS 106 is an example of a source impedance matching circuit and the impedance matching circuit IMCB 108 is an example of a bias impedance matching circuit. The impedance matching circuit IMCS 106 is coupled to the source generator 102 via a radio frequency (RF) cable 120A and the impedance matching circuit IMCB 108 is coupled to the bias generator 104 via another RF cable 120B. Moreover, the system 100 includes a plasma chamber 110, which is a capacitively coupled plasma (CCP) chamber. The impedance matching circuit IMCS 106 is coupled to the plasma chamber 110 via an RF transmission line 122A and the impedance matching circuit IMCB 108 is coupled to the plasma chamber 110 via another RF transmission line 122B.

The source generator 102 includes a digital signal processor (DSPS), multiple parameter controllers PRS1S, PRS2S, and PRS3S, a driver system 124A, and multiple frequency controllers FCS1S, FCS2S, and FCS3S. A parameter, as used herein, is voltage or power. Moreover, the source generator 102 includes a source RF power supply. The digital signal processor of the source generator 102 is coupled to a processor (P) of a host computer via a transfer cable TCS. Moreover, the digital signal processor of the source generator 102 is coupled to the parameter controllers PRS1S, PRS2S, and PRS3S, and the frequency controllers FCS1S, FCS2S, and FCS3S. The parameter controllers PRS1S, PRS2S, and PRS3S and the frequency controllers FCS1S, FCS2S, and FCS3S are coupled to the driver system 124A, which is coupled to the source RF power supply. The host computer further includes a memory device (M) that is coupled to the processor of the host computer.

Similarly, the bias generator 104 includes a digital signal processor (DSPB), multiple parameter controllers PRS1B, PRS2B, and PRS3B, a driver system 124B, and multiple frequency controllers FCS1B, FCS2B, and FCS3B. Moreover, the bias generator 104 includes a bias RF power supply. The digital signal processor of the bias generator 104 is coupled to the processor of the host computer via a transfer cable TCB. Moreover, the digital signal processor of the bias generator 104 is coupled to the parameter controllers PRS1B, PRS2B, and PRS3B, and the frequency controllers FCS1B, FCS2B, and FCS3B. The parameter controllers PRS1B, PRS2B, and PRS3B and the frequency controllers FCS1B, FCS2B, and FCS3B are coupled to the driver system 124B, which is coupled to the bias RF power supply.

The plasma chamber 110 includes a substrate support 112, such as a chuck, in which a lower electrode 114 is embedded. The lower electrode 114 is an example of a substrate support electrode. Examples of the chuck include an electrostatic chuck (ESC) and a magnetic chuck. A substrate S is placed on the substrate support 112. A substrate, as described herein, is used to make one or more semiconductor chips, which are used in one or more electronic devices, such as a cell phone, or a tablet, or a processor, or a memory device, or a television, or a device that applies artificial intelligence, or a device which is a part of Internet of things (IoT). Moreover, facing the substrate support 112 is an upper electrode 116 of the plasma chamber 110. Between the upper electrode 116 and the substrate support 112, a gap 118, such as a processing volume, is formed. Each of the lower electrode 114 and the upper electrode 116 is made from a metal, such as aluminum or an alloy of aluminum.

Examples of the host computer include a desktop computer, a controller, a tablet, a server, a laptop computer, and a smart phone, etc. As used herein, a processor is an application specific integrated circuit (ASIC), or a digital signal processor, or a programmable logic device (PLD), or a central processing unit (CPU), or a microprocessor, or a microcontroller. As used herein, a controller includes an ASIC, or a PLD, or a CPU, or a microprocessor, or a microcontroller, or a processor, or a digital signal processor, and further includes a memory device. Examples of a memory device, as used herein, include a random access memory (RAM) and a read-only memory (ROM). To illustrate, a memory device is a flash memory, a hard disk, or a storage device, etc. A memory device is an example of a computer-readable medium. An example of a driver system, as used herein, includes one or more transistors. Another example of a driver system, as used herein, includes one or more transistors that are coupled to an amplifier. An example of an RF power supply, as used herein, include an RF oscillator that generates a sinusoidal signal at a radio frequency, such as, one ranging from and including 100 kHz to 100 MHz.

An example of the bias generator 104 is an X RF generator, where X ranges from and including 100 kilohertz (kHz) to 13 megahertz (MHz). To illustrate, the bias generator 104 is a 400 kHz generator. As another illustration, the bias generator 104 is a 2 MHz RF generator. As yet another illustration, the bias generator 104 has a frequency within a range from and including 100 kHz to 3 MHz. An example of the source generator 102 is a Y RF generator, where Y ranges from and including 13 MHz to 170 MHz. As an illustration, the source generator 102 has a frequency within a range from and including 40 MHz to 70 MHz. As another illustration, the source generator 102 is a 70 MHz RF generator or a 60 MHz RF generator or a 50 MHz RF generator or a 27 MHz RF generator or a 13.56 MHz RF generator. To further illustrate, the Y RF generate has an operating range from and including 57 MHz to 63 MHz.

An impedance matching circuit, as described herein, is a network of one or more components, such as one or more resistors, or one or more capacitors, or one or more inductors, or a combination thereof, that match an impedance of a load coupled to an output of the impedance matching circuit with an impedance of a source coupled to an input of the impedance matching circuit. Two or more of the components are coupled to each other in a parallel or serial manner. The impedance matching circuit matches an impedance of a load coupled to an output of the impedance matching circuit with that of a source coupled to one or more inputs of impedance matching circuit. For example, the impedance matching circuit IMCS 106 matches an impedance of the RF transmission line 122A and the plasma chamber 110 with that of the source generator 102 and the RF cable 120A. As another example, the impedance matching circuit IMCB 108 matches an impedance of the RF transmission line 122B and the plasma chamber 110 with that of the bias generator 104 and the RF cable 120B. The impedance matching circuit, as described herein, is sometimes referred to herein as a matchbox or an RF match or an impedance matching network or a match.

The processor of the host computer generates and sends a digital pulse signal DPS1 via the transfer cable TCS to the digital signal processor of the source generator 102 and sends the digital pulse signal DPS1 via the transfer cable TCB to the digital signal processor of the bias generator 104.

The digital pulse signal DPS1 has multiple states S1, S2, and S3 and transitions periodically between the states S1, S2, and S3.

In addition, the processor of the host computer sends a parameter level of an RF signal 116A for the state S1, a parameter level of the RF signal 116A for the state S2, and a parameter level of the RF signal 116A for the state S3 via the transfer cable TCS to the digital signal processor of the source generator 102. The RF signal 116A is to be generated by the source generator 102 and is an example of a source RF signal. Moreover, the processor of the host computer sends a frequency level of the RF signal 116A for the state S1, a frequency level of the RF signal 116A for the state S2, and a frequency level of the RF signal 116A for the state S3 via the transfer cable TCS to the digital signal processor of the source generator 102. The parameter levels and the frequency levels for the states S1 through S3 sent to the digital signal processor of the source generator 102 are identified by the processor of the host computer from the memory device of the host computer. Upon receiving the parameter levels and the frequency levels for the states S1 through S3, the digital signal processor of the source generator 102 sends the parameter level for the state S1 to the parameter controller PRS1S for storage in a memory device of the parameter controller PRS1S, sends the parameter level for the state S2 to the parameter controller PRS2S for storage in a memory device of the parameter controller PRS2S, sends the parameter level for the state S3 to the parameter controller PRS3S for storage in a memory device of the parameter controller PRS3S, sends the frequency level for the state S1 to the frequency controller FCS1S for storage in a memory device of the frequency controller FCS1S, sends the frequency level for the state S2 to the frequency controller FCS2S for storage in a memory device of the frequency controller FCS2S, and sends the frequency level for the state S3 to the frequency controller FCS3S for storage in a memory device of the frequency controller FCS3S.

Similarly, the processor of the host computer sends a parameter level of an RF signal 116B for the state S1, a parameter level of the RF signal 116B for the state S2, and a parameter level of the RF signal 116B for the state S3 via the transfer cable TCB to the digital signal processor of the bias generator 104. The RF signal 116B is to be generated by the bias generator 104 and is an example of a bias RF signal. Moreover, the processor of the host computer sends a frequency level of the RF signal 116B for the state S1, a frequency level of the RF signal 116B for the state S2, and a frequency level of the RF signal 116B for the state S3 via the transfer cable TCB to the digital signal processor of the bias generator 104. The parameter levels and the frequency levels for the states S1 through S3 sent to the digital signal processor of the bias generator 104 are identified by the processor of the host computer from the memory device of the host computer. Upon receiving the parameter levels and the frequency levels for the states S1 through S3, the digital signal processor of the bias generator 104 sends the parameter level for the state S1 to the parameter controller PRS1B for storage in a memory device of the parameter controller PRS1B, sends the parameter level for the state S2 to the parameter controller PRS2B for storage in a memory device of the parameter controller PRS2B, sends the parameter level for the state S3 to the parameter controller PRS3B for storage in a memory device of the parameter controller PRS3B, sends the frequency level for the state S1 to the frequency controller FCS1B for storage in a memory device of the frequency controller FCS1B, sends the frequency level for the state S2 to the frequency controller FCS2B for storage in a memory device of the frequency controller FCS2B, and sends the frequency level for the state S3 to the frequency controller FCS3B for storage in a memory device of the frequency controller FCS3B.

Each of the digital signal processors of the source generator 102 and the bias generator 104 determines whether the digital pulse signal DPS1 has the state S1, S2, or S3. For example, each of the digital signal processors of the source generator 102 and the bias generator 104 determines whether a logic level of the digital pulse signal DPS1 is greater than, equal to, or lower than a predetermined threshold. Upon determining that the logic level of the digital pulse signal DPS1 is greater than the predetermined threshold, each of the digital signal processors of the source generator 102 and the bias generator 104 identifies an occurrence of the state of the digital pulse signal DPS1 to be S1. On the other hand, upon determining that the logic level of the digital pulse signal DPS1 is less than the predetermined threshold, each of the digital signal processors of the source generator 102 and the bias generator 104 identifies an occurrence of the state of the digital pulse signal DPS1 to be S3. Also, upon determining that the logic level of the digital pulse signal DPS1 is equal to the predetermined threshold, each of the digital signal processors of the source generator 102 and the bias generator 104 identifies an occurrence of the state of the digital pulse signal DPS1 to be S2. As another example, each of the digital signal processors of the source generator 102 and the bias generator 104 determines whether the logic level of the digital pulse signal DPS1 is zero, one, or two. Upon determining that the logic level of the digital pulse signal DPS1 is two, each of the digital signal processors of the source generator 102 and the bias generator 104 identifies the occurrence of the state of the digital pulse signal DPS1 to be S1. Similarly, upon determining that the logic level of the digital pulse signal DPS1 is one, each of the digital signal processors of the source generator 102 and the bias generator 104 identifies the occurrence of the state of the digital pulse signal 136 to be S2. Upon determining that the logic level of the digital pulse signal DPS1 is zero, each of the digital signal processors of the source generator 102 and the bias generator 104 identifies the occurrence of the state of the digital pulse signal DPS1 to be S3.

During a time period in which the digital pulse signal DPS1 has an occurrence of the state S1, the digital signal processor of the source generator 102 sends a signal indicating the state S1 to each of the parameter controller PRS1S and the frequency controller FCS1S. Moreover, during a time period in which the digital pulse signal DPS1 has an occurrence of the state S2, the digital signal processor of the source generator 102 sends a signal indicating the state S2 to each of the parameter controller PRS2S and the frequency controller FCS2S. Also, during a time period in which the digital pulse signal DPS1 has an occurrence of the state S3, the digital signal processor of the source generator 102 sends a signal indicating the state S3 to each of the parameter controller PRS3S and the frequency controller FCS3S.

Moreover, during the time period in which the digital pulse signal DPS1 has an occurrence of the state S1, upon receiving the signal indicating the state S1, the parameter controller PRS1S accesses the parameter level for the state S1 from the memory device of the parameter controller PRS1S and sends the parameter level for the state S1 to the driver system 124A of the source generator 102. Similarly, during the time period in which the digital pulse signal DPS1 has an occurrence of the state S1, upon receiving the signal indicating the state S1, the frequency controller FCS1S accesses the frequency level for the state S1 from the memory device of the frequency controller FCS and sends the frequency level for the state S1 to the driver system 124A of the source generator 102.

Furthermore, during the time period in which the digital pulse signal DPS1 has an occurrence of the state S2, upon receiving the signal indicating the state S2, the parameter controller PRS2S accesses the parameter level for the state S2 from the memory device of the parameter controller PRS2S and sends the parameter level for the state S2 to the driver system 124A of the source generator 102. Similarly, during the time period in which the digital pulse signal DPS1 has an occurrence of the state S2, upon receiving the signal indicating the state S2, the frequency controller FCS2S accesses the frequency level for the state S2 from the memory device of the frequency controller FCS2S and sends the frequency level for the state S2 to the driver system 124A of the source generator 102.

Also, during the time period in which the digital pulse signal DPS1 has an occurrence of the state S3, upon receiving the signal indicating the state S3, the parameter controller PRS3S accesses the parameter level for the state S3 from the memory device of the parameter controller PRS3S and sends the parameter level for the state S3 to the driver system 124A of the source generator 102. Similarly, during the time period in which the digital pulse signal DPS1 has an occurrence of the state S3, upon receiving the signal indicating the state S3, the frequency controller FCS3S accesses the frequency level for the state S3 from the memory device of the frequency controller FCS3S and sends the frequency level for the state S3 to the driver system 124A of the source generator 102.

During the time period in which the digital pulse signal DPS1 has an occurrence of the state S1, the driver system 124A of the source generator 102 receives the parameter level for the state S1 and the frequency level for the state S1 and generates a current signal based on the parameter level for the state S1 and the frequency level for the state S1, and provides the current signal to the source RF power supply. Also, during the time period in which the digital pulse signal DPS1 has an occurrence of the state S1, the source RF power supply generates a portion of the RF signal 116A for the state S1 upon receiving the current signal from the driver system 124A of the source generator 102. The portion of the RF signal 116A for the state S1 has the parameter level for the state S1 and the frequency level for the state S1 during the occurrence of the state S1 of the digital pulse signal DPS1.

Similarly, during the time period in which the digital pulse signal DPS1 has an occurrence of the state S2, the driver system 124A of the source generator 102 receives the parameter level for the state S2 and the frequency level for the state S2 and generates a current signal based on the parameter level for the state S2 and the frequency level for the state S2, and provides the current signal to the source RF power supply. Also, during the time period in which the digital pulse signal DPS1 has an occurrence of the state S2, the source RF power supply generates a portion of the RF signal 116A for the state S2 upon receiving the current signal from the driver system 124A of the source generator 102. The portion of the RF signal 116A for the state S2 has the parameter level for the state S2 and the frequency level for the state S2 during the occurrence of the state S2 of the digital pulse signal DPS1.

Also, during the time period in which the digital pulse signal DPS1 has an occurrence of the state S3, the driver system 124A of the source generator 102 receives the parameter level for the state S3 and the frequency level for the state S3 and generates a current signal based on the parameter level for the state S3 and the frequency level for the state S3, and provides the current signal to the source RF power supply. Also, during the time period in which the digital pulse signal DPS1 has an occurrence of the state S3, the source RF power supply generates a portion of the RF signal 116A for the state S3 upon receiving the current signal from the driver system 124A of the source generator 102. The portion of the RF signal 116A for the state S3 has the parameter level for the state S3 and the frequency level for the state S3 during the occurrence of the state S3 of the digital pulse signal DPS1.

The impedance matching circuit IMCS 106 receives the RF signal 116A via the RF cable 120A and matches an impedance of the load coupled to the output of the impedance matching circuit IMCS 106 with that of the source coupled to the input of the impedance matching circuit IMCS 106 to generate a modified RF signal 126A. The modified RF signal 126A is an example of an output of the impedance matching circuit IMCS 106. The modified RF signal 126A is supplied from the output of the impedance matching circuit IMCS 106 to the upper electrode 116.

Similarly, during a time period in which the digital pulse signal DPS1 has an occurrence of the state S1, the digital signal processor of the bias generator 104 sends a signal indicating the state S1 to each of the parameter controller PRS1B and the frequency controller FCS1B of the bias generator 104. Moreover, during a time period in which the digital pulse signal DPS1 has an occurrence of the state S2, the digital signal processor of the bias generator 104 sends a signal indicating the state S2 to each of the parameter controller PRS2B and the frequency controller FCS2B. Also, during a time period in which the digital pulse signal DPS1 has an occurrence of the state S3, the digital signal processor of the bias generator 104 sends a signal indicating the state S3 to each of the parameter controller PRS3B and the frequency controller FCS3B.

Moreover, during the time period in which the digital pulse signal DPS1 has an occurrence of the state S1, upon receiving the signal indicating the state S1, the parameter controller PRS1B accesses the parameter level for the state S1 from the memory device of the parameter controller PRS1B and sends the parameter level for the state S1 to the driver system 124B of the bias generator 104. Similarly, during the time period in which the digital pulse signal DPS1 has an occurrence of the state S1, upon receiving the signal indicating the state S1, the frequency controller FCS1B accesses the frequency level for the state S1 from the memory device of the frequency controller FCS1B and sends the frequency level for the state S1 to the driver system 124B of the source generator 102.

Furthermore, during the time period in which the digital pulse signal DPS1 has an occurrence of the state S2, upon receiving the signal indicating the state S2, the parameter controller PRS2B accesses the parameter level for the state S2 from the memory device of the parameter controller PRS2B and sends the parameter level for the state S2 to the driver system 124B of the bias generator 104. Similarly, during the time period in which the digital pulse signal DPS1 has an occurrence of the state S2, upon receiving the signal indicating the state S2, the frequency controller FCS2B accesses the frequency level for the state S2 from the memory device of the frequency controller FCS2B and sends the frequency level for the state S2 to the driver system 124B of the bias generator 104.

Also, during the time period in which the digital pulse signal DPS1 has an occurrence of the state S3, upon receiving the signal indicating the state S3, the parameter controller PRS3B accesses the parameter level for the state S3 from the memory device of the parameter controller PRS3B and sends the parameter level for the state S3 to the driver system 124B of the bias generator 104. Similarly, during the time period in which the digital pulse signal DPS1 has an occurrence of the state S3, upon receiving the signal indicating the state S3, the frequency controller FCS3B accesses the frequency level for the state S3 from the memory device of the frequency controller FCS3B and sends the frequency level for the state S3 to the driver system 124B of the bias generator 104.

During the time period in which the digital pulse signal DPS1 has an occurrence of the state S1, the driver system 124B of the bias generator 104 receives the parameter level for the state S1 and the frequency level for the state S1 and generates a current signal based on the parameter level for the state S1 and the frequency level for the state S1, and provides the current signal to the bias RF power supply. Also, during the time period in which the digital pulse signal DPS1 has an occurrence of the state S1, the bias RF power supply generates a portion of the RF signal 116B for the state S1 upon receiving the current signal from the driver system 124B of the bias generator 104. The portion of the RF signal 116B for the state S1 has the parameter level for the state S1 and the frequency level for the state S1 during the occurrence of the state S1 of the digital pulse signal DPS1.

Similarly, during the time period in which the digital pulse signal DPS1 has an occurrence of the state S2, the driver system 124B of the bias generator 104 receives the parameter level for the state S2 and the frequency level for the state S2 and generates a current signal based on the parameter level for the state S2 and the frequency level for the state S2, and provides the current signal to the bias RF power supply. Also, during the time period in which the digital pulse signal DPS1 has an occurrence of the state S2, the bias RF power supply generates a portion of the RF signal 116B for the state S2 upon receiving the current signal from the driver system 124B of the bias generator 104. The portion of the RF signal 116B for the state S2 has the parameter level for the state S2 and the frequency level for the state S2 during the occurrence of the state S2 of the digital pulse signal DPS1.

Also, during the time period in which the digital pulse signal DPS1 has an occurrence of the state S3, the driver system 124B of the bias generator 104 receives the parameter level for the state S3 and the frequency level for the state S3 and generates a current signal based on the parameter level for the state S3 and the frequency level for the state S3, and provides the current signal to the bias RF power supply. Also, during the time period in which the digital pulse signal DPS1 has an occurrence of the state S3, the bias RF power supply generates a portion of the RF signal 116B for the state S3 upon receiving the current signal from the driver system 124B of the bias generator 104. The portion of the RF signal 116B for the state S3 has the parameter level for the state S3 and the frequency level for the state S3 during the occurrence of the state S3 of the digital pulse signal DPS1.

The impedance matching circuit IMCB 108 receives the RF signal 116B via the RF cable 120B and matches an impedance of the load coupled to the output of the impedance matching circuit IMCB 108 with that of the source coupled to the input of the impedance matching circuit IMCB 108 to generate a modified RF signal 126B. The modified RF signal 126B is an example of an output of the impedance matching circuit IMCB 108. The modified RF signal 126B is supplied from the output of the impedance matching circuit IMCB 108 to the lower electrode 114 of the substrate support 112 to control, such as manage, processing of the substrate S. Examples of processing the substrate S include conducting an etch operation on the substrate S, or depositing a material on the substrate S, or sputtering the substrate S, or cleaning the substrate S, or a combination of two or more thereof.

When one or more process gases are supplied to the plasma chamber 110 in addition to supplying the modified RF signals 126A and 126B, plasma is stricken or maintained within the gap 118 of the plasma chamber 110 to process the substrate S. The processing of the substrate S is controlled, for example, by including a parameter level of the RF signal 116A for the state S2 and including a parameter level of the RF signal 116B for the state S2. During the state S2, the RF signal 116A has a parameter level and the RF signal 116B has a parameter level for generating plasma ions that sputter a mask material of the substrate S downward to protect a substrate layer of the substrate S. By sputtering the mask material downward, there is an increase in a critical dimension at a neck of the substrate S. Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc. Examples of processing a substrate, as described herein, include depositing a material on the substrate, etching the substrate, cleaning the substrate, and sputtering the substrate.

In some embodiments, any number of RF generators are coupled to an impedance matching circuit, described herein, such as IMCS 106 or IMCB 108. For example, an additional RF generator is coupled to another input of the impedance matching circuit via another RF cable to generate and send an RF signal to the other input of impedance matching circuit.

In several embodiments, instead of or in addition to being identified by the processor of the host computer, the parameter levels for the states S1 through S3 sent to the digital signal processor of the source generator 102 and the parameter levels for the states S1 through S3 sent to the digital signal processor of the bias generator 104 are received from a user via an input device, such as a keyboard or a mouse or stylus, that is coupled to the processor of the host computer via an input/output interface. Similarly, in some embodiments, instead of or in addition to being identified by the processor of the host computer, the frequency levels for the states S1 through S3 sent to the digital signal processor of the source generator 102 and the frequency levels for the states S1 through S3 sent to the digital signal processor of the bias generator 104 are received from the user via the input device.

In some embodiments, each parameter level, described herein, of an RF signal, is an envelope of the RF signal. For example, a parameter level, described herein, of an RF signal is a zero-to-peak magnitude of the RF signal or a peak-to-peak magnitude of the RF signal.

Also, in various embodiments, a parameter level of a parameter of an RF signal includes one or more magnitudes, such as amplitudes or values, of the parameter of the RF signal and the one or more magnitudes are exclusive of one or more magnitudes of another parameter level of the parameter of the RF signal. For example, the parameter level sent to the digital signal processor of the source generator 102 for the state S2 has one or more values, none of which are the same as one or more values of the parameter level sent to the digital signal processor of the source generator 102 for the state S1. Moreover, the parameter level sent to the digital signal processor of the source generator 102 for the state S3 has one or more values, none of which are the same as one or more values of the parameter level sent to the digital signal processor of the source generator 102 for the state S2. Also, the parameter level sent to the digital signal processor of the source generator 102 for the state S3 has one or more values, none of which are the same as one or more values of the parameter level sent to the digital signal processor of the source generator 102 for the state S1. As another example, the parameter level sent to the digital signal processor of the bias generator 104 for the state S2 has one or more values, none of which are the same as one or more values of the parameter level sent to the digital signal processor of the bias generator 104 for the state S1. Moreover, the parameter level sent to the digital signal processor of the bias generator 104 for the state S3 has one or more values, none of which are the same as one or more values of the parameter level sent to the digital signal processor of the bias generator 104 for the state S2. Also, the parameter level sent to the digital signal processor of the bias generator 104 for the state S3 has one or more values, none of which are the same as one or more values of the parameter level sent to the digital signal processor of the bias generator 104 for the state S1.

In various embodiments, instead of the multiple frequency controllers FCS1S, FCS2S, and FCS3S of the source generator 102, one frequency controller is used to control the source RF power supply to generate a single frequency level of an RF signal instead of the multiple frequency levels for the states S1 through S3. The single frequency level includes one or more values of frequency of the RF signal. The single frequency level represents a continuous wave of frequency. The processor of the host computer sends a value of the single frequency level of the RF signal to the digital signal processor of the source generator 102. Upon receiving the value of the single frequency level, regardless of whether the state of the digital pulse signal DPS1 is S1 or S2 or S3, the digital signal processor of the source generator 102 sends the value of the single frequency level to the frequency controller for storage in a memory device of the frequency controller. Moreover, upon receiving the value of the single frequency level, regardless of whether the state of the digital pulse signal DPS1 is S1 or S2 or S3, the frequency controller sends the value to the driver system 124A. The driver system 124A generates a current signal based on the value of the single frequency level and provides the current signal to the source RF power supply. Upon receiving the current signal, the source RF power supply generates the RF signal having the single frequency level and the multiple parameter levels for the states S1 through S3.

Similarly, in some embodiments, instead of the multiple frequency controllers FCS1B, FCS2B, and FCS3B of the bias generator 104, one frequency controller is used to control the bias RF power supply to generate a single frequency level of an RF signal instead of the multiple frequency levels for the states S1 through S3. The single frequency level includes one or more values of frequency of the RF signal and represents a continuous wave of frequency. The processor of the host computer sends a value of the single frequency level of the RF signal to the digital signal processor of the bias generator 104. Upon receiving the value of the single frequency level, regardless of whether the state of the digital pulse signal DPS1 is S1 or S2 or S3, the digital signal processor of the bias generator 104 sends the value to the frequency controller for storage in a memory device of the frequency controller. Moreover, upon receiving the value of the single frequency level, regardless of whether the state of the digital pulse signal DPS1 is S1 or S2 or S3, the frequency controller sends the value of the single frequency level to the driver system 124B. The driver system 124B generates a current signal based on the value of the single frequency level and provides the current signal to the bias RF power supply. Upon receiving the current signal, the bias RF power supply generates the RF signal having the single frequency level and the multiple parameter levels for the states S1 through S3.

In various embodiments, one or more functions described herein as being performed by the processor of the host computer are instead performed by the digital signal processor of the source generator 102. For example, instead of the processor of the host computer providing the parameter levels and the frequency levels for the states S1 through S3 to the digital signal processor of the source generator 102, the parameter levels and the frequency levels are stored in a memory device coupled the digital signal processor of the source generator 102 and are accessed by the digital signal processor of the source generator 102 from the memory device and sent to the parameter controllers PRS1S, PRS2S, and PRS3S and to the frequency controllers FCS1S, FCS2S, and FCS3S based on whether the state of the digital pulse signal DPS1 received from the processor of the host computer is S1, S2, or S3. As another example, instead of the digital pulse signal DPS1 being generated by the processor of the host computer, the digital pulse signal DPS1 is generated by the digital signal processor of the source generator 102 and sent to the digital signal processor of the bias generator 104 via a transfer cable that couples the two digital signal processors of the source and bias generators 102 and 104. As yet example, instead of the processor of the host computer providing the parameter levels and the frequency levels for the states S1 through S3 to the digital signal processor of the bias generator 104, the parameter levels and the frequency levels are stored in a memory device coupled the digital signal processor of the bias generator 104 and are accessed by the digital signal processor of the bias generator 104 from the memory device and sent to the parameter controllers PRS1B, PRS2B, and PRS3B and to the frequency controllers FCS1B, FCS2B, and FCS3B based on whether the state of the digital pulse signal DPS1 received from the processor of the host computer is S1, S2, or S3. As another example, instead of the digital pulse signal DPS1 being generated by the processor of the host computer, the digital pulse signal DPS1 is generated by the digital signal processor of the bias generator 104 and sent to the digital signal processor of the source generator 102 via the transfer cable that couples the two digital signal processors of the source and bias generators 102 and 104.

In various embodiments, one or more functions described herein as being performed by the digital signal processor of the source generator 102 and the controllers PRS1S, PRS2S, PRS3S, FCS1S, FCS2S, and FCS3S of the source generator 102 are instead performed by the processor of the host computer. For example, the processor of the host computer is coupled to the driver system 124A without being coupled to the digital signal processor of the source generator 102. The functions described herein as being performed by the digital signal processor of the source generator 102 and the controllers PRS1S, PRS2S, PRS3S, FCS1S, FCS2S, and FCS3S of the source generator 102 are computer programs or computer modules that are executed by the processor of the host computer.

Similarly, in some embodiments, one or more functions described herein as being performed by the digital signal processor of the bias generator 104 and the controllers PRS1B, PRS2B, PRS3B, FCS1B, FCS2B, and FCS3B of the bias generator 104 are instead performed by the processor of the host computer 124A. For example, the processor of the host computer is coupled to the driver system 124B without being coupled to the digital signal processor of the bias generator 104. The functions described herein as being performed by the digital signal processor of the bias generator 104 and the controllers PRS1B, PRS2B, PRS3B, FCS1B, FCS2B, and FCS3B of the bias generator 104 are computer programs or computer modules that are executed by the processor of the host computer.

In various embodiments, one or more functions described herein as being performed by the controllers PRS1S, PRS2S, PRS3S, FCS1S, FCS2S, and FCS3S of the source generator 102 are instead performed by the digital signal processor of the source generator 102. For example, the digital signal processor of the source generator 102 is coupled to the driver system 124A without being coupled to the controllers PRS1S, PRS2S, PRS3S, FCS1S, FCS2S, and FCS3S. The functions described herein as being performed by the controllers PRS1S, PRS2S, PRS3S, FCS1S, FCS2S, and FCS3S of the source generator 102 are computer programs or computer modules that are executed by the digital signal processor of the source generator 102.

Similarly, in some embodiments, one or more functions described herein as being performed by the controllers PRS1B, PRS2B, PRS3B, FCS1B, FCS2B, and FCS3B of the bias generator 104 are instead performed by the digital signal processor of the bias generator 104. For example, the digital signal processor of the bias generator 104 is coupled to the driver system 124B without being coupled to the controllers PRS1B, PRS2B, PRS3B, FCS1B, FCS2B, and FCS3B. The functions described herein as being performed by the controllers PRS1B, PRS2B, PRS3B, FCS1B, FCS2B, and FCS3B of the bias generator 104 are computer programs or computer modules that are executed by the digital signal processor of the bias generator 104.

In various embodiments, one or more functions described herein as being performed by the digital signal processor of the source generator 102, the controllers PRS1S, PRS2S, PRS3S of the source generator 102, and the controller that is used to generate the single frequency level of the source generator 102 are instead performed by the processor of the host computer. For example, the processor of the host computer is coupled to the driver system 124A without being coupled to the digital signal processor of the source generator 102. The functions described herein as being performed by the digital signal processor of the source generator 102, the controllers PRS1S, PRS2S, PRS3S of the source generator 102, and the controller that is used to generate the single frequency level of the source generator 102 are computer programs or computer modules that are executed by the processor of the host computer.

Similarly, in some embodiments, one or more functions described herein as being performed by the digital signal processor of the bias generator 104, the controllers PRS1B, PRS2B, and PRS3B of the bias generator 104, and the controller that is used to generate the single frequency level of the bias generator 104 are instead performed by the processor of the host computer. For example, the processor of the host computer is coupled to the driver system 124B without being coupled to the digital signal processor of the bias generator 104. The functions described herein as being performed by the digital signal processor of the bias generator 104, the controllers PRS1B, PRS2B, and PRS3B of the bias generator 104, and the controller that is used to generate the single frequency level of the bias generator 104 are computer programs or computer modules that are executed by the processor of the host computer.

In various embodiments, one or more functions described herein as being performed by the controllers PRS1S, PRS2S, PRS3S of the source generator 102 and the controller that is used to generate the single frequency level of the source generator 102 are instead performed by the digital signal processor of the source generator 102. For example, the digital signal processor of the source generator 102 is coupled to the driver system 124A without being coupled to the controllers PRS1S, PRS2S, PRS3S of the source generator 102 and without being coupled to the controller that is used to generate the single frequency level of the source generator 102. The functions described herein as being performed by the controllers PRS1S, PRS2S, and PRS3S of the source generator 102 and the controller that is used to generate the single frequency level of the source generator 102 are computer programs or computer modules that are executed by the digital signal processor of the source generator 102.

Similarly, in some embodiments, one or more functions described herein as being performed by the controllers PRS1B, PRS2B, and PRS3B of the bias generator 104 and the controller that is used to generate the single frequency level of the bias generator 104 are instead performed by the digital signal processor of the bias generator 104. For example, the digital signal processor of the bias generator 104 is coupled to the driver system 124B without being coupled to the controllers PRS1B, PRS2B, and PRS3B of the bias generator 104 and without being coupled to the controller that is used to generate the single frequency level of the bias generator 104. The functions described herein as being performed by the controllers PRS1B, PRS2B, and PRS3B of the bias generator 104 and the controller that is used to generate the single frequency level of the bias generator 104 are computer programs or computer modules that are executed by the digital signal processor of the bias generator 104.

Figure 1B:
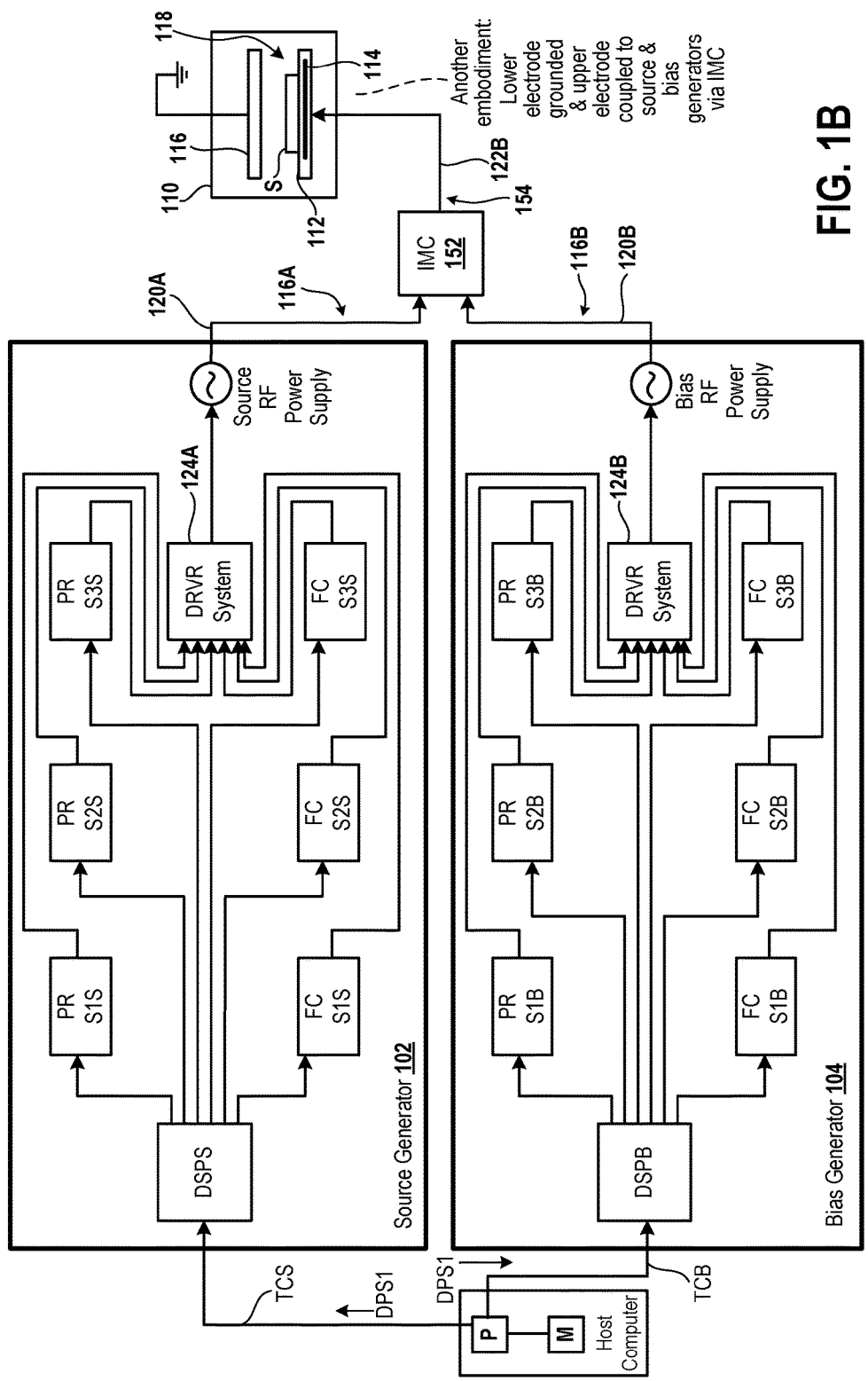
FIG. 1B is a diagram of an embodiment of another system to illustrate generation of three or more states to achieve a high aspect ratio dielectric etch.

FIG. 1B is a diagram of an embodiment of a system 150 to illustrate generation of three or more states to achieve a high aspect ratio dielectric etch. The system 150 includes the source generator 102, the bias generator 104, the host computer, the RF cables 120A and 120B, an impedance matching circuit IMC 152, the RF transmission line 122B, and the plasma chamber 110. The impedance matching circuit IMC 152 is coupled to the RF cables 120A and 120B and is also coupled to the RF transmission line 122B. The upper electrode 116 is coupled to a ground potential, e.g., is grounded.

The impedance matching circuit IMC 152 receives the RF signal 116A generated by the source generator 102 and the RF signal 116B generated by the bias generator 104, and matches an impedance of a load coupled to an output of the impedance matching circuit IMC 152 to an impedance of a source coupled to inputs of the impedance matching circuit IMC 152 to generate a modified RF signal 154. For example, the impedance matching circuit IMC 152 matches an impedance of the RF transmission line 122B and the plasma chamber 110 with an impedance of the RF cables 120A and 120B, the source generator 102, and the bias generator 104. The modified RF signal 154 is an example of an output of the impedance matching circuit IMC 152. The lower electrode 112 receives the modified RF signal 152. When the one or more process gases are supplied to the plasma chamber 110 with the modified RF signal 152, plasma is stricken or maintained within the gap 118 of the plasma chamber 110 to process the substrate S.

In various embodiments, instead of the upper electrode 116 being grounded, the lower electrode 112 is grounded and the upper electrode 106 is coupled to the RF transmission line 122B to receive the modified RF signal 154.

Figure 2A:
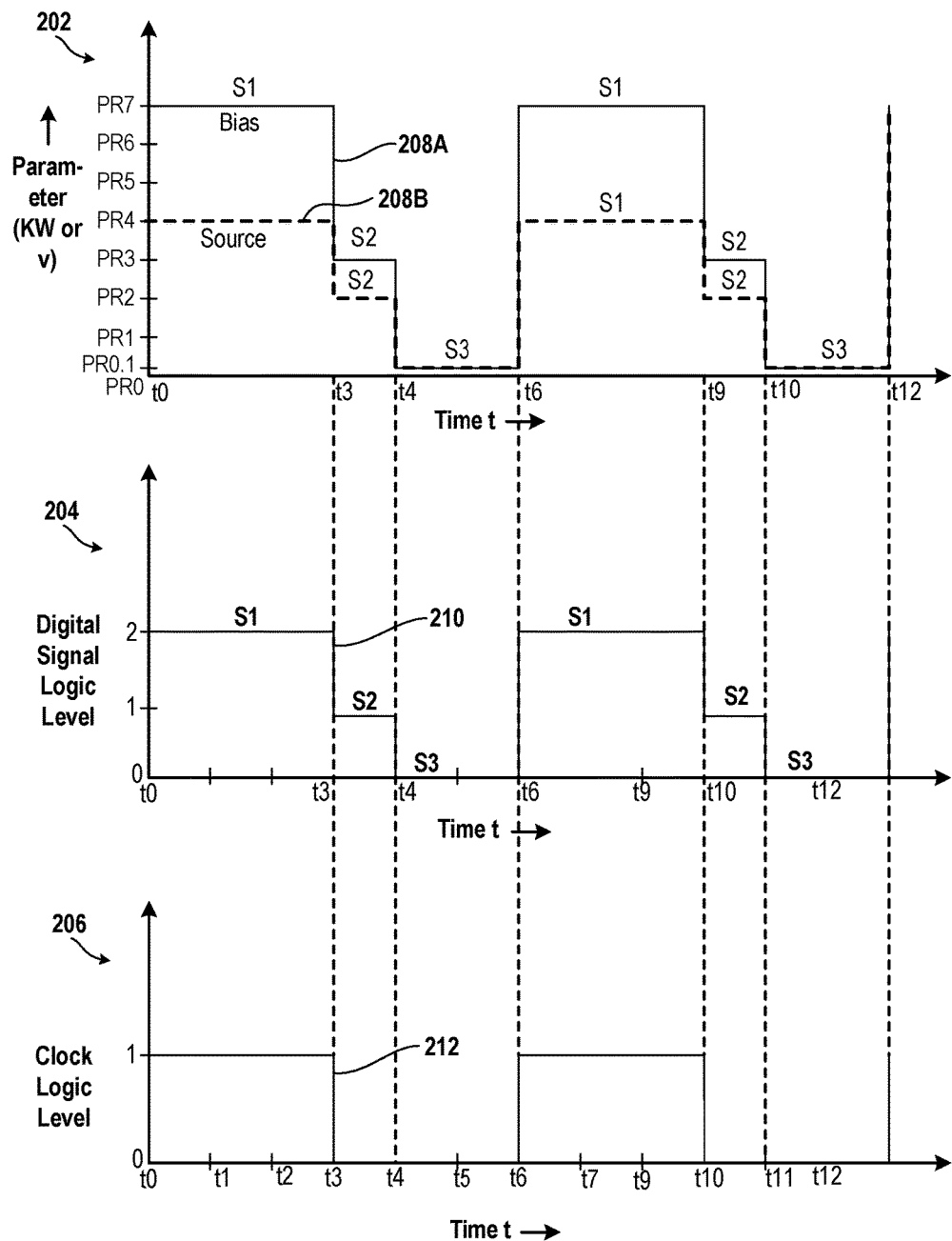
FIG. 2A shows embodiments of multiple graphs to illustrate a parameter of a radio frequency (RF) signal generated by a bias generator of FIGS. 1A and 1B and a parameter of another RF signal generated by a source generator of FIGS. 1A and 1B.

FIG. 2A shows embodiments of graphs 202, 204, and 206 to illustrate a parameter 208A of the RF signal 116B generated by the bias generator 104 of FIGS. 1A and 1B and a parameter 208B of the RF signal 116A generated by the source generator 102 of FIGS. 1A and 1B. The graph 202 plots the parameters 208A and 208B versus time t. Moreover, the graph 204 plots a logic level of a digital pulse signal 210 versus the time t and the graph 206 plots a logic level of a clock signal 212 versus the time t. The digital pulse signal 210 is an example of the digital pulse signal DPS1 of FIG. 1.

The clock signal 212 is generated by the processor of the host computer of FIG. 1. For example, the clock signal 212 is generated by a clock signal source, such as a crystal oscillator, within the processor of the host computer. The clock signal 212 alternates between a logic level 1 and a logic level 0. For example, the clock signal 212 is at the logic level 1 during a time period between a time t3 and a time t0. The time period between the times t3 and 0 includes a time t1 and a time t2. The clock signal 212 transitions at the time t3 from the logic level 1 to the logic level 0 and remains at the logic level 0 for a time period between a time t6 and the time t3. The time period between the times t6 and t3 includes a time t4 and a time t5. The clock signal 212 transitions at the time t6 from the logic level 0 to the logic level 1 and stays at the logic level 1 for a time period between a time t9 and the time t6. The time period between the times t9 and t6 includes a time t7 and a time t8. The clock signal 212 transitions from the logic level 1 to the logic level 0 at the time t9 and is at the logic level 0 for a time period between a time t12 and the time t9. The time period between the times t12 and t9 include a time t10 and a time t11. The clock signal 212 transitions from the logic level 0 to the logic level 1 at the time t12.

The digital pulse signal 210 transitions from a logic level 0 to a logic level 2 at the time t0 and is at the logic level 2 for an occurrence of the state S1, which is time period between the time t3 and the time t0. The digital pulse signal 210 transitions from the logic level 2 to a logic level 1 at the time t3 and remains at the logic level 1 for an occurrence of the state S2, which is a time period between the time t4 and the time t3. The digital pulse signal 210 transitions from the logic level 1 to the logic level 0 at the time t4 and remains at the logic level 0 for an occurrence of the state S3, which is a time period between the time t6 and the time t4. The digital pulse signal 210 transitions from the logic level 0 to the logic level 2 at the time t6 and is at the logic level 2 for another occurrence of the state S1, which is a time period between the time t6 and the time t9. The digital pulse signal 210 transitions from the logic level 2 to a logic level 1 at the time t9 and remains at the logic level 1 for another occurrence of the state S2, which is time period between the time t9 and the time t10. The digital pulse signal 210 transitions from the logic level 1 to the logic level 0 at the time t10 and remains at the logic level 0 for another occurrence of the state S3, which is a time period between the time t10 and the time t12. The digital pulse signal 210 transitions from the logic level 0 to the logic level 2 at the time t12.

It should be noted that during the time period between the time t3 and t0, the digital pulse signal 210 provides an occurrence of the state S1, during the time period between the times t3 and t4, the digital pulse signal 210 provides an occurrence of the state S2, and during the time period between the times t4 and t6, the digital pulse signal 210 provides an occurrence of the state S3. Similarly, during the time period between the time t6 and t9, the digital pulse signal 210 provides another occurrence of the state S1, during the time period between the times t9 and t10, the digital pulse signal 210 provides another occurrence of the state S2, and during the time period between the times t10 and t12, the digital pulse signal 210 provides another occurrence of the state S3.

The parameter 208A is at a parameter level PR7 during the time period between t0 and t3 for which the digital pulse signal 210 has the state S1. The parameter 208A transitions from the parameter level PR7 to a parameter level PR3 substantially at the time t3 and remains at the parameter level PR3 during the time period between the times t3 and t4 for which the digital pulse signal 210 has the state S2. The parameter 208A transitions from the parameter level PR3 to a parameter level PR0.1 substantially at the time t4 and remains at the parameter level PR0.1 for the time period between the times t4 and t6 for which the digital pulse signal 210 has the state S3. The parameter 208A transitions from the parameter level PR0.1 to the parameter level PR7 substantially at the time t6 and remains at the parameter level PR7 for the time period between the times t6 and t9 for which the digital pulse signal 210 has the state S1.

The parameter 208A transitions from the parameter level PR7 to the parameter level PR3 substantially at the time t9 and remains at the parameter level PR3 during the time period between t9 and t10 for which the digital pulse signal 210 has the state S2. The parameter 208A transitions from the parameter level PR3 to the parameter level PR0.1 substantially at the time t10 and remains at the parameter level PR0.1 for the time period between the time t10 and t12 for which the digital pulse signal 210 has the state S3. The parameter 208A transitions from the parameter level PR0.1 to the parameter level PR7 substantially at the time t12.

The parameter 208B is at a parameter level PR4 during the time period between t0 and t3 for which the digital pulse signal 210 has the state S1. The parameter 208B transitions from the parameter level PR4 to a parameter level PR2 substantially at the time t3 and remains at the parameter level PR2 during the time period between t3 and t4 for which the digital pulse signal 210 has the state S2. The parameter 208B transitions from the parameter level PR2 to a parameter level PR0.1 substantially at the time t4 and remains at the parameter level PR0.1 for the time period between the times t4 and t6 for which the digital pulse signal 210 has the state S3. The parameter 208B transitions from the parameter level PR0.1 to the parameter level PR4 substantially at the time t6 and remains at the parameter level PR4 for the time period between the times t6 and t9 for which the digital pulse signal 210 has the state S1.

The parameter 208B transitions from the parameter level PR4 to the parameter level PR2 substantially at the time t9 and remains at the parameter level PR2 during the time period between t9 and t10 for which the digital pulse signal 210 has the state S2. The parameter 208B transitions from the parameter level PR2 to the parameter level PR0.1 substantially at the time t10 and remains at the parameter level PR0.1 for the time period between the time t10 and t12 for which the digital pulse signal 210 has the state S3. The parameter 208B transitions from the parameter level PR0.1 to the parameter level PR4 substantially at the time t12.

It should be noted that in some embodiments, a transition from one parameter level to another parameter level substantially at a time occurs within a pre-determined time period from the time. For example, a transition from a first parameter level to a second parameter level occurs substantially at the time t3 when the transition occurs within a pre-determined number of microseconds or a pre-determined fraction of a millisecond from the time t3. As another example, a transition from a first parameter level to a second parameter level occurs substantially at the time t3 when the transition occurs at the time t3.

It should further be noted that the parameter level PR0.1 is greater than a parameter level of PR0, such as a zero parameter level. A parameter level PR1 is greater than the parameter level PR0.1 and the parameter level PR2 is greater than the parameter level PR1. The parameter level PR3 is greater than the parameter level PR2 and the parameter level PR4 is greater than the parameter level PR3. A parameter level PR5 is greater than the parameter level PR4 and a parameter level PR6 is greater than the parameter level PR5. The parameter level PR7 is greater than the parameter level PR6.

It should also be noted that the time t of the clock signal 212 is divided into equal segments. For example, a time period between the times t1 and t2 is equal to a time period between the time t0 and t1. Similarly, a time period between the times t2 and t3 is equal to a time period between the time t1 and t2, a time period between the times t3 and t4 is equal to a time period between the time t2 and t3, a time period between the times t4 and t5 is equal to a time period between the time t3 and t4, and a time period between the times t5 and t6 is equal to a time period between the time t5 and t6. Also, a time period between the times t6 and t7 is equal to a time period between the time t5 and t6, a time period between the times t7 and t8 is equal to a time period between the time t6 and t7, a time period between the times t8 and t9 is equal to a time period between the time t7 and t8, and a time period between the times t9 and t10 is equal to a time period between the time t8 and t9. Moreover, a time period between the times t11 and t12 is equal to a time period between the time t10 and t11 and a time period between the times t11 and t12 is equal to a time period between the time t10 and t11.

In various embodiments, the parameter 208A transitions from the parameter PR7 to another parameter level between the parameter levels PR0.1 and PR7 substantially at the time t3 or substantially at the time t9, and remains at the other parameter level during the state S2. Also, the parameter 208A transitions from the parameter PR3 to another parameter level, such as one between the parameter levels PR0.1 and PR3 or the parameter level PR0, substantially at the time t4 or substantially at the time t10, and remains at the other parameter level during the state S3.

In some embodiments, the parameter 208B transitions from the parameter PR4 to another parameter level between the parameter levels PR0.1 and PR4 substantially at the time t3 or substantially at the time t9, and remains at the other parameter level during the state S2. Also, the parameter 208B transitions from the parameter PR2 to another parameter level, such as one between the parameter levels PR0.1 and PR2 or the parameter level PR0, substantially at the time t4 or substantially at the time t10, and remains at the other parameter level during the state S3.

In some embodiments, the processor of the host computer modifies the digital pulse signal 210 to change a duration of the state S2 of the digital pulse signal 210. For example, the processor of the host computer modifies the digital pulse signal 210 to have the logic level 1 for a time period that is greater than or lower than the time period between the times t4 and t3. To illustrate, the processor of the host computer modifies the digital pulse signal 210 to have the logic level 1 for a time period from the time t3 to a time between the time t4 and a time t5.5. The time t5.5 is less than the time t6 and greater than the time t5. The state S3 of the digital pulse signal 210 reduces to a time period between the time t5.5 and t6. As another illustration, the processor of the host computer modifies the digital pulse signal 210 to have the logic level 1 for a time period from a time between a time t1.5 and the time t3 to the time t4. The time t1.5 is less than the time t2 and greater than the time t1. The state S1 of the digital pulse signal 210 reduces to a time period between the time t0 and t1.5. As yet another illustration, the processor of the host computer modifies the digital pulse signal 210 to have the logic level 1 for a time period from the time t1.5 to the time t5.5. As another illustration, the duration for which the digital pulse signal DPS1 has the state S2 is at most 30% of the time period between the times t0 and t6 and of the time period between the times t6 and t12. To further illustrate, the duration for which the digital pulse signal DPS1 has the state S2 ranges from and including 1% to 30% of the time period between the times t0 and t6 and of the time period between the times t6 and t12. As another illustration, the duration for which the digital pulse signal DPS1 has the state S2 ranges from and including 1% to 20% of the time period between the times t0 and t6 and of the time period between the times t6 and t12.

Figure 2B:
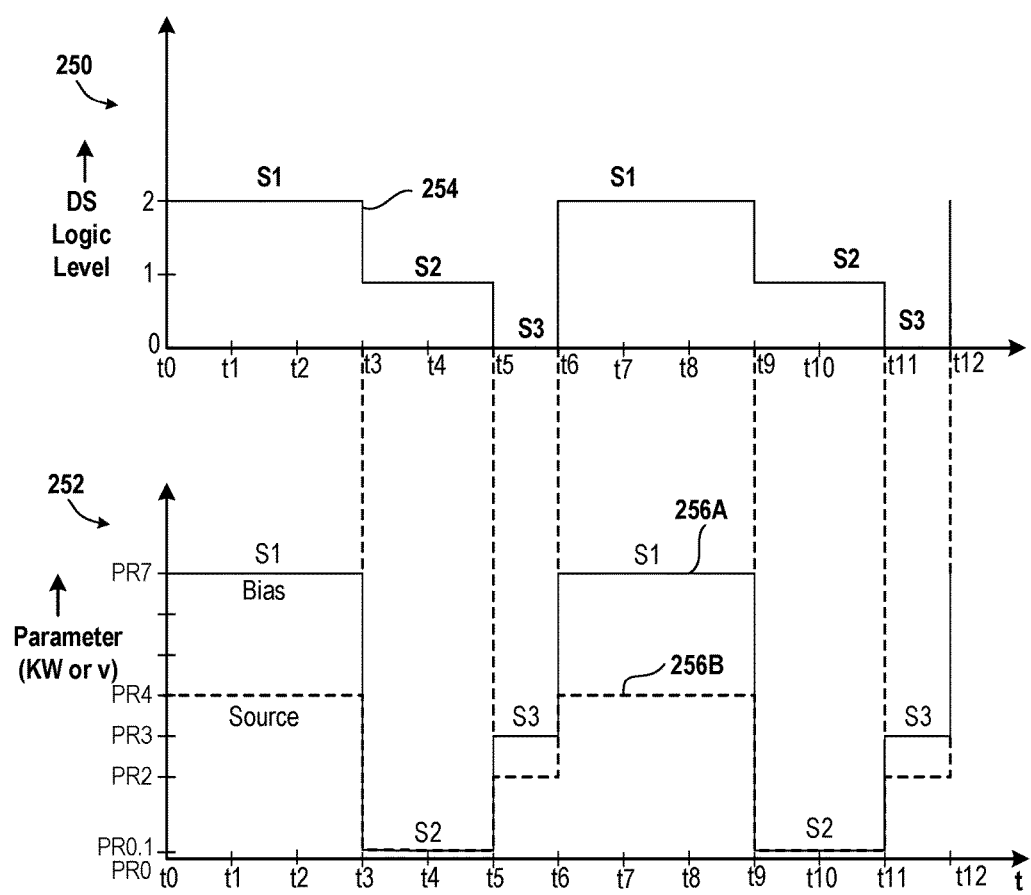
FIG. 2B shows embodiments of multiple graphs to illustrate a parameter of the RF signal generated by the bias generator of FIGS. 1A and 1B and another parameter of the RF signal generated by the source generator of FIGS. 1A and 1B.

FIG. 2B is an embodiment of a graph 250 to illustrate another digital pulse signal 254 and an embodiment of a graph 252 to illustrate a parameter 256A of the RF signal 116B generated by the bias generator 104 of FIGS. 1A and 1B and another parameter 256B of the RF signal 116A generated by the source generator 102 of FIGS. 1A and 1B. The graph 250 plots a logic level of the digital pulse signal 254 versus the time t. The digital pulse signal 254 is an example of the digital pulse signal DPS1 of FIG. 1. The graph 252 plots the parameters 256A and 256B versus the time t. The parameter 256A is synchronized to the clock signal 212 of FIG. 2A and to the digital pulse signal 254. Similarly, the parameter 256B is synchronized to the clock signal 212 of FIG. 2A and to the digital pulse signal 254.

The digital pulse signal 254 transitions from the logic level 0 to the logic level 2 at the time t0 and is at the logic level 2 for an occurrence of the state S1, which is the time period between the time t3 and the time t0, of the digital pulse signal 254. The digital pulse signal 254 transitions from the logic level 1 to the logic level 0 at the time t3 and remains at the logic level 1 for an occurrence of the state S2, which is a time period between the time t5 and the time t3, of the digital pulse signal 254. The digital pulse signal 254 transitions from the logic level 1 to the logic level 0 at the time t5 and remains at the logic level 0 for an occurrence of the state S3, which is a time period between the time t6 and the time t5, of the digital pulse signal 254. The digital pulse signal 254 transitions from the logic level 0 to the logic level 2 at the time t6 and is at the logic level 2 for another occurrence of the state S1, which is the time period between the time t6 and the time t9, of the digital pulse signal 254. The digital pulse signal 254 transitions from the logic level 2 to a logic level 1 at the time t9 and remains at the logic level 1 for another occurrence of the state S2, which is a time period between the time t9 and the time t11, of the digital pulse signal 254. The digital pulse signal 254 transitions from the logic level 1 to the logic level 0 at the time t11 and remains at the logic level 0 for another occurrence of the state S3, which is a time period between the time t11 and the time t12, of the digital pulse signal 254. The digital pulse signal 254 transitions from the logic level 0 to the logic level 2 at the time t12.

It should be noted that during the time period between the time t3 and t0, the digital pulse signal 254 provides an occurrence of the state S1, during the time period between the times t3 and t5, the digital pulse signal 254 provides an occurrence of the state S2, and during the time period between the times t5 and t6, the digital pulse signal 254 provides an occurrence of the state S3. Similarly, during the time period between the time t6 and t9, the digital pulse signal 254 provides another occurrence of the state S1, during the time period between the times t9 and t11, the digital pulse signal 254 provides another occurrence of the state S2, and during the time period between the times t11 and t12, the digital pulse signal 254 provides another occurrence of the state S3.

The parameter 256A is at the parameter level PR7 during the time period between t0 and t3 for which the digital pulse signal 254 has the state S1. The parameter 256A transitions from the parameter level PR7 to the parameter level PR0.1 substantially at the time t3 and remains at the parameter level PR0.1 during the time period between t3 and t5 for which the digital pulse signal 254 has the state S2. The parameter 256A transitions from the parameter level PR0.1 to the parameter level PR3 substantially at the time t5 and remains at the parameter level PR3 for the time period between the times t5 and t6 for which the digital pulse signal 254 has the state S3. The parameter 256A transitions from the parameter level PR3 to the parameter level PR7 substantially at the time t6 and remains at the parameter level PR7 for the time period between the times t6 and t9 for which the digital pulse signal 254 has the state S1.

The parameter 256A transitions from the parameter level PR7 to the parameter level PR0.1 substantially at the time t9 and remains at the parameter level PR0.1 during the time period between t9 and t11 for which the digital pulse signal 254 has the state S2. The parameter 256A transitions from the parameter level PR0.1 to the parameter level PR3 substantially at the time t11 and remains at the parameter level PR3 for the time period between the time t11 and t12 for which the digital pulse signal 254 has the state S3. The parameter 256A transitions from the parameter level PR3 to the parameter level PR7 substantially at the time t12.

The parameter 256B is at a parameter level PR4 during the time period between t0 and t3 for which the digital pulse signal 254 has the state S1. The parameter 256B transitions from the parameter level PR4 to the parameter level PR0.1 substantially at the time t3 and remains at the parameter level PR0.1 during the time period between t3 and t5 for which the digital pulse signal 254 has the state S2. The parameter 256B transitions from the parameter level PR0.1 to the parameter level PR2 substantially at the time t5 and remains at the parameter level PR2 for the time period between the times t5 and t6 for which the digital pulse signal 254 has the state S3. The parameter 256B transitions from the parameter level PR2 to the parameter level PR4 substantially at the time t6 and remains at the parameter level PR4 for the time period between the times t6 and t9 for which the digital pulse signal 254 has the state S1.

The parameter 256B transitions from the parameter level PR4 to the parameter level PR0.1 substantially at the time t9 and remains at the parameter level PR0.1 during the time period between t9 and t11 for which the digital pulse signal 254 has the state S2. The parameter 256B transitions from the parameter level PR0.1 to the parameter level PR2 substantially at the time t11 and remains at the parameter level PR2 for the time period between the time t11 and t12 for which the digital pulse signal 254 has the state S3. The parameter 256B transitions from the parameter level PR2 to the parameter level PR4 substantially at the time t12.

In various embodiments, the parameter 256A transitions from the parameter PR7 to another parameter level, such as one between the parameter levels PR0.1 and PR3 or the parameter level PR0, substantially at the time t3 or substantially at the time t9, and remains at the other parameter level during the state S2. Also, the parameter 256A transitions from the parameter PR0.1 to another parameter level between the parameter levels PR0.1 and PR7 substantially at the time t5 or substantially at the time t11, and remains at the other parameter level during the state S3.

In some embodiments, the parameter 256B transitions from the parameter PR4 to another parameter level, such as one between the parameter levels PR0.1 and PR4 or the parameter level PR0, substantially at the time t3 or substantially at the time t9 and remains at the other parameter level during the state S2. Also, the parameter 256B transitions from the parameter PR0.1 to another parameter level, between the parameter levels PR0.1 and PR4, substantially at the time t5 or substantially at the time t11 and remains at the other parameter level during the state S3.

In some embodiments, the processor of the host computer modifies the digital pulse signal 254 to change a duration of the state S2 of the digital pulse signal 254. For example, the processor of the host computer modifies the digital pulse signal 254 to have the logic level 1 for a time period that is greater than or lower than the time period between the times t3 and t5. To illustrate, the processor of the host computer modifies the digital pulse signal 254 to have the logic level 1 for a time period from the time t3 to a time between the time t5 and the time t5.5. The time t5.5 is less than the time t6 and greater than the time t5. The state S3 of the digital pulse signal 254 reduces to a time period between the time t5.5 and t6. As another illustration, the processor of the host computer modifies the digital pulse signal 254 to have the logic level 1 for a time period from a time between a time t0.5 and the time t3 to the time t5. The time t0.5 is less than the time t1 and greater than the time t0. The state S1 of the digital pulse signal DPS1 reduces to a time period between the time t0 and t0.5. As yet another illustration, the processor of the host computer modifies the digital pulse signal 254 to have the logic level 1 for a time period from the time t0.5 to the time t5.5.

In various embodiments, a parameter level of each of the RF signals 116A and 116B during the state S1 of the digital pulse signal DPS1 is greater than 1 kilowatt (kW) and ion energy of ions within the plasma chamber 110 is greater than 2.5 kilo electron volts (keV). Also, during the state S1 of the digital pulse signal DPS1, pressure within the plasma chamber 110 is less than 30 milliTorr (mTorr) to obtain a narrow ion angle distribution function. During the state S2, ion energy of ions within the plasma chamber 110 is between 1.5 keV and 2.5 keV. Also, during the state S3, a parameter level of each of the RF signals 116A and 116B during the state S3 of the digital pulse signal DPS1 is less than 1 kilowatt and ion energy of ions within the plasma chamber 110 is less than 100 eV.

In several embodiments, a table is provided to illustrate various power level ranges of the source and bias generators 102 and 104 for the states S1 through S3 of the digital pulse signal DPS1.

TABLE I

| State | Bias Generator 104 power level range | Source Generator 102 power level range |
| --- | --- | --- |
| S1 | 5 kW-100 kW | 2 kW-20 kW |
| S2 | Between a power level for the state S1 and a power level for the state S3 | Less than or equal to a power level for the state S1 and greater than or equal to zero |
| S3 | <2 kW | <2 kW |

As illustrate in table I, a parameter level of the RF signal 116B generated by the bias generator 104 during the state S1 of the digital pulse signal DPS1 ranges from and including 5 kW to 100 kW. Also, a parameter level of the RF signal 116A generated by the source generator 102 during the state S1 of the digital pulse signal DPS1 ranges from and including 2 kW to 20 kW. Moreover, a parameter level of the RF signal 116B generated by the bias generator 104 during the state S3 of the digital pulse signal DPS1 ranges from and including 0 kW to less than 2 kW. Also, a parameter level of the RF signal 116A generated by the source generator 102 during the state S3 of the digital pulse signal DPS1 ranges from and including 0 kW to 2 kW. Also, a parameter level of the RF signal 116B generated by the bias generator 104 during the state S2 of the digital pulse signal DPS1 ranges between a value of a parameter level of the RF signal 116B during the state S1 and a value of a parameter level of the RF signal 116B during the state S3. Also, a parameter level of the RF signal 116A generated by the source generator 102 during the state S2 of the digital pulse signal DPS1 ranges from and including zero to a value of a parameter level of the RF signal 116A during the state S1.

Figure 3A:
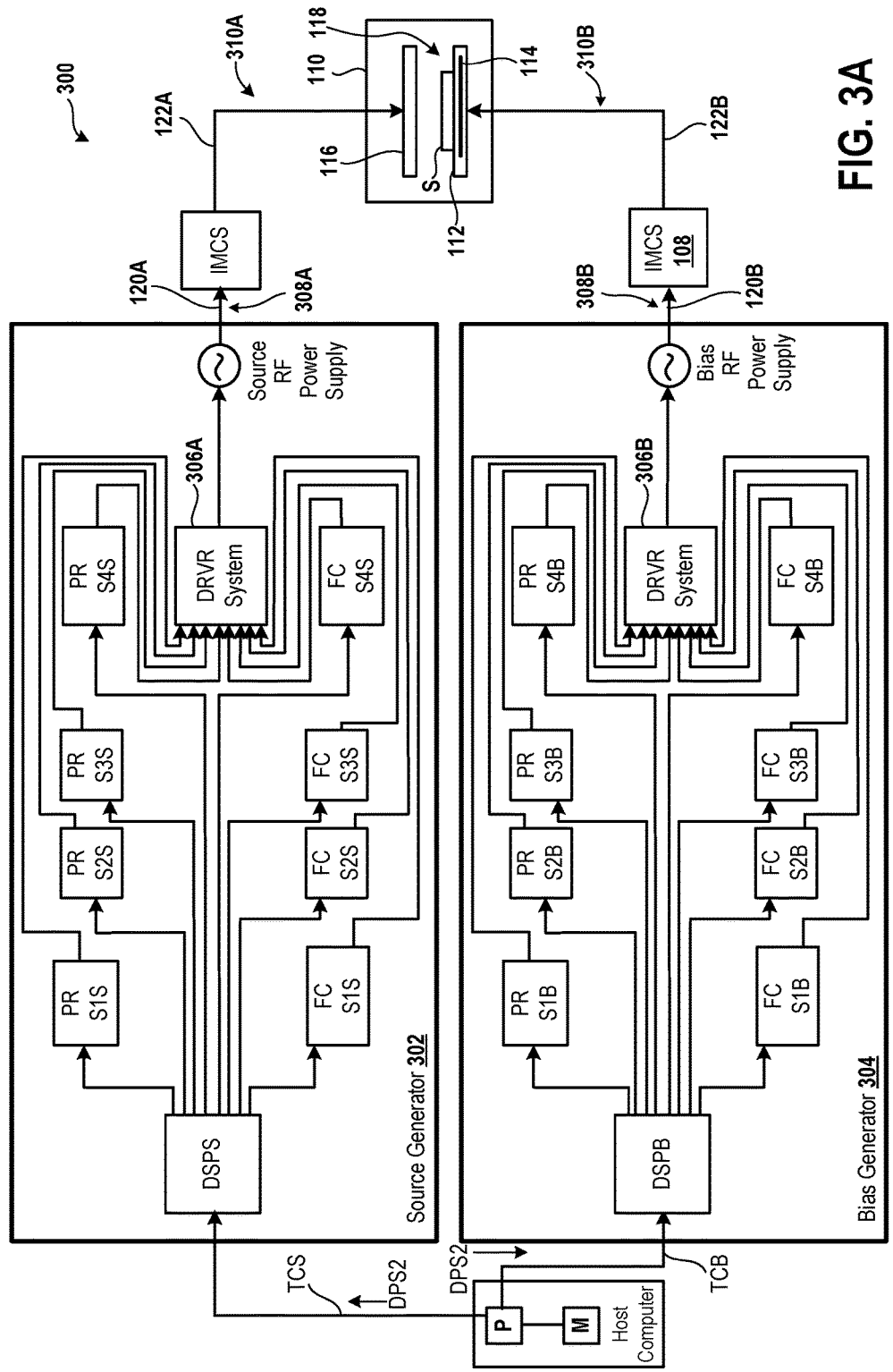
FIG. 3A is a diagram of an embodiment of a system to illustrate generation of four states to achieve a high aspect ratio dielectric etch.

FIG. 3A is a diagram of an embodiment of a system 300 to illustrate generation of four states to achieve a high aspect ratio dielectric etch. The system 300 includes a source generator 302 and a bias generator 304. The source generator 302 is an example of a source RF generator and the bias generator 304 is an example of a bias RF generator. The system 300 further includes the host computer, the source impedance matching circuit IMCS 106, the bias impedance matching circuit IMCB 108, and the plasma chamber 110.

The source generator 302 includes a digital signal processor (DSPS), the parameter controllers PRS1S, PRS2S, and PRS3S, the frequency controllers FCS1S, FCS2S, and FCS3S, a driver system 306A, and the source RF power supply. Moreover, the source generator 302 further includes a parameter controller PRS4S and a frequency controller FCS4S. The digital signal processor of the source generator 302 is coupled to the parameter controllers PRS1S, PRS2S, PRS3S, and PRS4S, and is also coupled to the frequency controllers FCS1S, FCS2S, FCS3S, and FCS4S. Moreover, the parameter controllers PRS1S, PRS2S, PRS3S, and PRS4S and the frequency controllers FCS1S, FCS2S, FCS3S, and FCS4S of the source generator 302 are coupled to the driver system 306A. The driver system 306A is coupled to the source RF power supply of the source generator 302.

The source generator 302 has the same operating frequency as that of the source generator 102 of FIGS. 1A and 1B operates and the bias generator 304 has the same operating frequency as that of the bias generator 104 of FIGS. 1A and 1B. For example, the source generator 302 is the X RF generator and the bias generator 304 is the Y RF generator. Both the X and Y RF generators are described above.

Similarly, the bias generator 304 includes a digital signal processor (DSPB), the parameter controllers PRS1B, PRS2B, and PRS3B, the frequency controllers FCS1B, FCS2B, and FCS3B, a driver system 306B, and the bias RF power supply. Moreover, the bias generator 304 further includes a parameter controller PRS4B and a frequency controller FCS4B. The digital signal processor of the bias generator 304 is coupled to the parameter controllers PRS1B, PRS2B, PRS3B, and PRS4B, and is also coupled to the frequency controllers FCS1B, FCS2B, FCS3B, and FCS4B. Moreover, the parameter controllers PRS1B, PRS2B, PRS3B, and PRS4B and the frequency controllers FCS1B, FCS2B, FCS3B, and FCS4B are coupled to the driver system 306B. The driver system 306B is coupled to the bias RF power supply of the bias generator 304. The digital signal processor of the source generator 302 is coupled to the processor of the host computer via the transfer cable TCS and the digital signal processor 304 of the bias generator 304 is coupled to the processor of the host computer via the transfer cable TCB.

A source coupled to an input of the impedance matching circuit IMCS 106 includes the RF cable 120A and the source generator 302. A load coupled to an output of the impedance matching circuit IMCS 106 includes the RF transmission line 122A and the plasma chamber 110. Moreover, a source coupled to an input of the impedance matching circuit IMCB 108 includes the RF cable 120B and the bias generator 304. A load coupled to an output of the impedance matching circuit IMCB 108 includes the RF transmission line 122B and the plasma chamber 110.

The processor of the host computer generates and sends a digital pulse signal DPS2 via the transfer cable TCS to the digital signal processor of the source generator 302 and sends the digital pulse signal DPS2 via the transfer cable TCB to the digital signal processor of the bias generator 304. The digital pulse signal DPS2 has multiple states S1, S2, S3, and S4 and transitions periodically between the states S1, S2, S3, and S4.

In addition to sending multiple parameter levels for the states S1 through S3 of the digital pulse signal DPS2 to the digital signal processors of the source and bias generators 302 and 304 in the same manner in which the parameter levels for the state S1 through S3 of the digital signal pulse DPS1 are sent, the processor of the host computer sends a parameter level for the state S4 of the digital pulse signal DPS2 to the digital signal processor of the source generator 302 and a parameter level for the state S4 of the digital pulse signal DPS2 to the digital signal processor of the bias generator 304. Moreover, in addition to sending multiple frequency levels for the states S1 through S3 of the digital pulse signal DPS2 to the digital signal processors of the source and bias generators 302 and 304 in the same manner in which the frequency levels for the state S1 through S3 of the digital signal pulse DPS1 are sent, the processor of the host computer sends a frequency level for the state S4 of the digital pulse signal DPS2 to the digital signal processor of the source generator 302 and a frequency level for the state S4 of the digital pulse signal DPS2 to the digital signal processor of the bias generator 304.

The parameter levels and the frequency levels for the states S1 through S4 of the digital pulse signal DPS2 sent to the digital signal processor of the source and bias generators 302 and 304 are identified by the processor of the host computer from the memory device of the host computer. Upon receiving the parameter levels and the frequency levels for the states S1 through S4 of the digital pulse signal DPS2, in addition to sending the parameter levels for the states S1 through S3 of the digital pulse signal DPS2 to the corresponding parameter controllers PRS1S through PRS3S of the source generator 302 and in addition to sending the frequency levels for the states S1 through S3 of the digital pulse signal DPS2 to the corresponding frequency controllers FCS1S through FCS3S of the source generator 302, the digital signal processor of the source generator 302 sends the parameter level for the state S4 to the parameter controller PRS4S for storage in a memory device of the parameter controller PRS4S and sends the frequency level for the state S4 to the frequency controller FCS4S for storage in a memory device of the frequency controller FCS4S. Similarly, upon receiving the parameter levels and the frequency levels for the states S1 through S4 of the digital pulse signal DPS2, in addition to sending the parameter levels for the states S1 through S3 of the digital pulse signal DPS2 to the corresponding parameter controllers PRS1B through PRS3B of the bias generator 302 and in addition to sending the frequency levels for the states S1 through S3 of the digital pulse signal DPS2 to the corresponding frequency controllers FCS1B through FCS3B of the bias generator 302, the digital signal processor of the bias generator 304 sends the parameter level for the state S4 to the parameter controller PRS4B for storage in a memory device of the parameter controller PRS4B and sends the frequency level for the state S4 to the frequency controller FCS4B for storage in a memory device of the frequency controller FCS4B.

Each of the digital signal processors of the source and bias generators 302 and 304 determines whether the digital pulse signal DPS2 has the state S1, S2, S3, or S4. For example, of the digital signal processors of the source and bias generators 302 and 304 determines whether a logic level of the digital pulse signal DPS2 is greater than a first predetermined threshold, is equal to the first predetermined threshold, is equal to a second predetermined threshold, or is lower that the second predetermined threshold. The second predetermined threshold is lower than the first predetermined threshold. Upon determining that the logic level of the digital pulse signal DPS2 is greater than the first predetermined threshold, each of the digital signal processors of the source and bias generators 302 and 304 identifies an occurrence of the state of the digital pulse signal DPS2 to be S1. On the other hand, upon determining that the logic level of the digital pulse signal DPS2 is equal to the first predetermined threshold, each of the digital signal processors of the source and bias generators 302 and 304 identifies an occurrence of the state of the digital pulse signal DPS2 to be S2. Also, upon determining that the logic level of the digital pulse signal DPS2 is equal to the second predetermined threshold, each of the digital signal processors of the source and bias generators 302 and 304 identifies an occurrence of the state of the digital pulse signal DPS2 to be S3. Upon determining that the logic level of the digital pulse signal DPS2 is lower than the second predetermined threshold, each of the digital signal processors of the source and bias generators 302 and 304 identifies an occurrence of the state of the digital pulse signal DPS2 to be S4. As another example, each of the digital signal processors of the source and bias generators 302 and 304 determines whether a logic level of the digital pulse signal DPS2 is three. Upon determining that the logic level of the digital pulse signal DPS2 is three, each of the digital signal processors of the source and bias generators 302 and 304 identifies the occurrence of the state of the digital pulse signal DPS2 to be S1. Similarly, upon determining that a logic level of the digital pulse signal DPS2 is two, each of the digital signal processors of the source and bias generators 302 and 304 identifies the occurrence of the state of the digital pulse signal DPS2 to be S2. Also, upon determining that the logic level of the digital pulse signal DPS2 is one, each of the digital signal processors of the source and bias generators 302 and 304 identifies the occurrence of the state of the digital pulse signal DPS2 to be S3. Upon determining that the logic level of the digital pulse signal DPS2 is zero, each of the digital signal processors of the source and bias generators 302 and 304 identifies the occurrence of the state of the digital pulse signal DPS2 to be S4.

During the time periods in which the digital pulse signal DPS2 has occurrences of the states S1, S2, and S3, the digital signal processor of the source generator 302 sends multiple signals indicating the states S1, S2, and S3 of the digital pulse signal DPS2 to the corresponding parameter controllers PRS1S, PRS2S, and PRS3S of the source generator 302 and to the corresponding frequency controllers FCS1S, FCS2S, and FCS3S of the source generator 302 in a manner described above with reference to the digital signal processor of the source generator 102 of FIG. 1A. Moreover, during the time period in which the digital pulse signal DPS2 has an occurrence of the state S4 of the digital pulse signal DPS2, the digital signal processor of the source generator 302 sends a signal indicating the state S4 to the parameter controller PRS4S of the source generator 302 and sends a signal indicating the state S4 to the frequency controller FCS4S of the source generator 302.

Similarly, during the time periods in which the digital pulse signal DPS2 has occurrences of the states S1, S2, and S3 of the digital pulse signal DPS2, the digital signal processor of the bias generator 304 sends multiple signals indicating the states S1, S2, and S3 of the digital pulse signal DPS2 to the corresponding parameter controllers PRS1B, PRS2B, and PRS3B of the bias generator 304 and to the corresponding frequency controllers FCS1B, FCS2B, and FCS3B of the bias generator 304 in a manner described above with reference to the digital signal processor of the bias generator 104 of FIG. 1A. Moreover, during the time period in which the digital pulse signal DPS2 has an occurrence of the state S4 of the digital pulse signal DPS2, the digital signal processor of the bias generator 304 sends a signal indicating the state S4 to the parameter controller PRS4B of the bias generator 304 and sends a signal indicating the state S4 to the frequency controller FCS4B of the bias generator 304.

During the time periods in which the digital pulse signal DPS2 has occurrences of the states S1 through S3, upon receiving the signals indicating the states S1 through S3 of the digital pulse signal DPS2, the parameter controllers PRS1S, PRS2S, and PRS3S of the source generator 302 access the corresponding parameter levels for the states S1 through S3 of the digital pulse signal DPS2 from the corresponding memory devices of the parameter controllers PRS1S, PRS2S, and PRS3S of the source generator 302 in a manner described above with reference to the source generator 102 of FIG. 1A and sends the parameter levels for the states S1 through S3 of the digital pulse signal DPS2 to the driver system 306A of the source generator 302. Similarly, during the time periods in which the digital pulse signal DPS2 has occurrences of the states S1 through S3, upon receiving the signals indicating the stated S1 through S3, the frequency controllers FCS1S, FCS2S, and FCS3S of the source generator 302 access the corresponding frequency levels for the states S1 through S3 of the digital pulse signal DPS2 from the corresponding memory devices of the frequency controllers FCS1S, FCS2S, and FCS3S of the source generator 302 in a manner described above with reference to the source generator 102 of FIG. 1A and sends the frequency levels for the states S1 through S3 of the digital pulse signal DPS2 to the driver system 306A of the source generator 302.

Moreover, during the time period in which the digital pulse signal DPS2 has an occurrence of the state S4, upon receiving the signal indicating the state S4, the parameter controller PRS4S accesses the parameter level for the state S4 from the corresponding memory device of the parameter controller PRS4S and sends the parameter level for the state S4 to the driver system 306A of the source generator 302. Similarly, during the time period in which the digital pulse signal DPS2 has an occurrence of the state S4, upon receiving the signal indicating the state S4, the frequency controller FCS4S accesses the frequency level for the state S4 from the corresponding memory device of the frequency controller FCS4S and sends the frequency level for the state S4 to the driver system 306A of the source generator 302.

During the time periods in which the digital pulse signal DPS2 has occurrences of the states S1 through S3, the driver system 306A of the source generator 302 receives the parameter levels for the states S1 through S3 of the digital pulse signal DPS2 and the frequency levels for the states S1 through S3 of the digital pulse signal DPS2 in the same manner described above in which the driver system 124A of the source generator 102 receives the parameter levels for the states S1 through S3 of the digital pulse signal DPS1 and the frequency levels for the states S1 through S3 of the digital pulse signal DPS1. Moreover, during the time period in which the digital pulse signal DPS2 has an occurrence of the state S4, the driver system 306A of the source generator 302 receives the parameter level for the state S4 and the frequency level for the state S4.

Upon receiving the parameter level for the state S1 of the digital pulse signal DPS2 and the frequency level for the state S1 of the digital pulse signal DPS2, the driver system 306A of the source generator 302 generates a current signal based on the parameter level for the state S1 of the digital pulse signal DPS2 and the frequency level for the state S1 of the digital pulse signal DPS2, and provides the current signal to the source RF power supply of the source generator 302. During the time period in which the digital pulse signal DPS2 has an occurrence of the state S1 of the digital pulse signal DPS2, the source RF power supply of the source generator 302 generates a portion of an RF signal 308A for the state S1 of the digital pulse signal DPS2 upon receiving the current signal from the driver system 306A of the source generator 302. The RF signal 308A is an example of a source RF signal. The portion of the RF signal 308A for the state S1 of the digital pulse signal DPS2 has the parameter level for the state S1 of the digital pulse signal DPS2 and the frequency level for the state S1 of the digital pulse signal DPS2 during the occurrence of the state S1 of the digital pulse signal DPS2.

Similarly, upon receiving the parameter level for the state S2 of the digital pulse signal DPS2 and the frequency level for the state S2 of the digital pulse signal DPS2, the driver system 306A of the source generator 302 generates a current signal based on the parameter level for the state S2 of the digital pulse signal DPS2 and the frequency level for the state S2 of the digital pulse signal DPS2, and provides the current signal to the source RF power supply of the source generator 302. During the time period in which the digital pulse signal DPS2 has an occurrence of the state S2, the source RF power supply of the source generator 302 generates a portion of the RF signal 308A for the state S2 of the digital pulse signal DPS2 upon receiving the current signal from the driver system 306A of the source generator 302. The portion of the RF signal 308A for the state S2 of the digital pulse signal DPS2 has the parameter level for the state S2 of the digital pulse signal DPS2 and the frequency level for the state S2 of the digital pulse signal DPS2 during the occurrence of the state S2 of the digital pulse signal DPS2.

Also, upon receiving the parameter level for the state S3 of the digital pulse signal DPS2 and the frequency level for the state S3 of the digital pulse signal DPS2, the driver system 306A of the source generator 302 generates a current signal based on the parameter level for the state S3 of the digital pulse signal DPS2 and the frequency level for the state S3 of the digital pulse signal DPS2, and provides the current signal to the source RF power supply of the source generator 302. During the time period in which the digital pulse signal DPS2 has an occurrence of the state S3, the source RF power supply of the source generator 302 generates a portion of the RF signal 308A for the state S3 of the digital pulse signal DPS2 upon receiving the current signal from the driver system 306A of the source generator 302. The portion of the RF signal 308A for the state S3 of the digital pulse signal DPS2 has the parameter level for the state S3 of the digital pulse signal DPS2 and the frequency level for the state S3 of the digital pulse signal DPS2 during the occurrence of the state S3 of the digital pulse signal DPS2.

Moreover, upon receiving the parameter level for the state S4 and the frequency level for the state S4, the driver system 306A of the source generator 302 generates a current signal based on the parameter level for the state S4 and the frequency level for the state S4, and provides the current signal to the source RF power supply of the source generator 302. During the time period in which the digital pulse signal DPS2 has an occurrence of the state S4, the source RF power supply of the source generator 302 generates a portion of the RF signal 308A for the state S4 of the digital pulse signal DPS2 upon receiving the current signal from the driver system 306A of the source generator 302. The portion of the RF signal 308A for the state S4 of the digital pulse signal DPS2 has the parameter level for the state S4 and the frequency level for the state S4 during the occurrence of the state S4 of the digital pulse signal DPS2.

Furthermore, during the time periods in which the digital pulse signal DPS2 has occurrences of the states S1 through S3, upon receiving the signals indicating the states S1 through S3 of the digital pulse signal DPS2, the parameter controllers PRS1B, PRS2B, and PRS3B of the bias generator 304 access the corresponding parameter levels for the states S1 through S3 of the digital pulse signal DPS2 from the corresponding memory devices of the parameter controllers PRS1B, PRS2B, and PRS3B in a manner described above with reference to the bias generator 104 of FIG. 1A and sends the parameter levels for the states S1 through S3 of the digital pulse signal DPS2 to the driver system 306B of the bias generator 304. Similarly, during the time periods in which the digital pulse signal DPS2 has occurrences of the states S1 through S3, upon receiving the signals indicating the states S1 through S3 of the digital pulse signal DPS2, the frequency controllers FCS1B, FCS2B, and FCS3B of the bias generator 304 access the corresponding frequency levels for the states S1 through S3 of the digital pulse signal DPS2 from the corresponding memory devices of the frequency controllers FCS1B, FCS2B, and FCS3B in a manner described above with reference to the bias generator 104 of FIG. 1A and sends the frequency levels for the states S1 through S3 of the digital pulse signal DPS2 to the driver system 306B of the bias generator 304.

Moreover, during the time period in which the digital pulse signal DPS2 has an occurrence of the state S4, upon receiving the signal indicating the state S4, the parameter controller PRS4B accesses the parameter level for the state S4 from the corresponding memory device of the parameter controller PRS4B and sends the parameter level for the state S4 to the driver system 306B of the bias generator 304. Similarly, during the time period in which the digital pulse signal DPS2 has an occurrence of the state S4, upon receiving the signal indicating the state S4, the frequency controller FCS4B accesses the frequency level for the state S4 from the corresponding memory device of the frequency controller FCS4B and sends the frequency level for the state S4 to the driver system 306B of the bias generator 304.

During the time periods in which the digital pulse signal DPS2 has occurrences of the states S1 through S3, the driver system 306B of the bias generator 304 receives the parameter levels for the states S1 through S3 of the digital pulse signal DPS2 and the frequency levels for the states S1 through S3 of the digital pulse signal DPS2 in the same manner described above in which the driver system 124B of the bias generator 104 receives the parameter levels for the states S1 through S3 of the digital pulse signal DPS1 and the frequency levels for the states S1 through S3 of the digital pulse signal DPS1. Moreover, during the time period in which the digital pulse signal DPS2 has an occurrence of the state S4, the driver system 306B of the bias generator 304 receives the parameter level for the state S4 and the frequency level for the state S4.

Upon receiving the parameter level and frequency level for the state S1 of the digital pulse signal DPS2, the driver system 306B of the bias generator 304 generates a current signal based on the parameter and frequency levels for the state S1 of the digital pulse signal DPS2, and provides the current signal to the source RF power supply of the bias generator 304. During the time period in which the digital pulse signal DPS2 has an occurrence of the state S1, the bias RF power supply of the bias generator 304 generates a portion of an RF signal 308B for the state S1 of the digital pulse signal DPS2 upon receiving the current signal from the driver system 306B of the bias generator 304. The RF signal 308B is an example of a bias RF signal. The portion of the RF signal 308B for the state S1 of the digital pulse signal DPS2 has the parameter and frequency levels for the state S1 of the digital pulse signal DPS2 during the occurrence of the state S1 of the digital pulse signal DPS2.

Similarly, upon receiving the parameter and frequency levels for the state S2 of the digital pulse signal DPS2, the driver system 306B of the bias generator 304 generates a current signal based on the parameter level and frequency levels for the state S2 of the digital pulse signal DPS2, and provides the current signal to the bias RF power supply of the bias generator 304. During the time period in which the digital pulse signal DPS2 has an occurrence of the state S2, the bias RF power supply of the bias generator 304 generates a portion of the RF signal 308B for the state S2 of the digital pulse signal DPS2 upon receiving the current signal from the driver system 306B of the bias generator 304. The portion of the RF signal 308B for the state S2 of the digital pulse signal DPS2 has the parameter level for the state S2 of the digital pulse signal DPS2 and the frequency level for the state S2 of the digital pulse signal DPS2 during the occurrence of the state S2 of the digital pulse signal DPS2.

Also, upon receiving the parameter and frequency levels for the state S3 of the digital pulse signal DPS2, the driver system 306B of the bias generator 304 generates a current signal based on the parameter and frequency levels for the state S3 of the digital pulse signal DPS2, and provides the current signal to the bias RF power supply of the bias generator 304. During the time period in which the digital pulse signal DPS2 has an occurrence of the state S3, the bias RF power supply of the bias generator 304 generates a portion of the RF signal 308B for the state S3 of the digital pulse signal DPS2 upon receiving the current signal from the driver system 306B of the bias generator 304. The portion of the RF signal 308B for the state S3 of the digital pulse signal DPS2 has the parameter and frequency levels for the state S3 of the digital pulse signal DPS2 during the occurrence of the state S3 of the digital pulse signal DPS2.

Moreover, upon receiving the parameter level for the state S4 and the frequency level for the state S4, the driver system 306B of the bias generator 304 generates a current signal based on the parameter level for the state S4 and the frequency level for the state S4, and provides the current signal to the bias RF power supply of the bias generator 304. During the time period in which the digital pulse signal DPS2 has an occurrence of the state S4, the bias RF power supply of the bias generator 304 generates a portion of the RF signal 308B for the state S4 of the digital pulse signal DPS2 upon receiving the current signal from the driver system 306B of the bias generator 304. The portion of the RF signal 308B for the state S4 of the digital pulse signal DPS2 has the parameter level for the state S4 and the frequency level for the state S4 during the occurrence of the state S4 of the digital pulse signal DPS2.

The impedance matching circuit IMCS 106 receives the RF signal 308A via the RF cable 120A and matches an impedance of the load coupled to the output of the impedance matching circuit IMCS 106 with that of the source coupled to the input of the impedance matching circuit IMCS 106 to generate a modified RF signal 310A. The modified RF signal 310A is supplied from the output of the impedance matching circuit IMCS 106 to the upper electrode 116.

Similarly, the impedance matching circuit IMCB 108 receives the RF signal 308B via the RF cable 120B and matches an impedance of the load coupled to the output of the impedance matching circuit IMCB 108 with that of the source coupled to the input of the impedance matching circuit IMCB 108 to generate a modified RF signal 310B. The modified RF signal 310B is supplied from the output of the impedance matching circuit IMCB 108 to the lower electrode 114. When one or more process gases are supplied to the plasma chamber 110 in addition to supplying the modified RF signals 310A and 310B, plasma is stricken or maintained within the gap 118 of the plasma chamber 110 to process the substrate S.

In several embodiments, instead of being identified by the processor of the host computer, the parameter levels for the states S1 through S4 of the digital pulse signal DPS2 sent to the digital signal processors of the source and bias generators 302 and 304 are received from the user via the input device coupled to the processor of the host computer via the input/output interface. Similarly, in some embodiments, instead of being identified by the processor of the host computer, the frequency levels for the states S1 through S4 sent to the digital signal processors of the source and bias generators 302 and 304 are received from the user via the input device.

Also, in various embodiments, as described above, a parameter level of an RF signal includes one or more magnitudes, such as amplitudes or values, of the parameter of the RF signal and the one or more magnitudes are exclusive of one or more magnitudes of another parameter level of the parameter of the RF signal. For example, the parameter level sent to the digital signal processor of the source generator 302 for the state S2 of the digital pulse signal DPS2 has one or more values, none of which are the same as one or more values of the parameter level sent to the digital signal processor of the source generator 302 for the state S1 of the digital pulse signal DPS2. Moreover, the parameter level sent to the digital signal processor of the source generator 302 for the state S3 of the digital pulse signal DPS2 has one or more values, none of which are the same as one or more values of the parameter level sent to the digital signal processor of the source generator 302 for the state S2 of the digital pulse signal DPS2 Also, the parameter level sent to the digital signal processor of the source generator 302 for the state S3 of the digital pulse signal DPS2 has one or more values, none of which are the same as one or more values of the parameter level sent to the digital signal processor of the source generator 302 for the state S1 of the digital pulse signal DPS2. The parameter level sent to the digital signal processor of the source generator 302 for the state S4 of the digital pulse signal DPS2 has one or more values, none of which are the same as one or more values of the parameter level sent to the digital signal processor of the source generator 302 for the state S3 of the digital pulse signal DPS2. Also, the parameter level sent to the digital signal processor of the source generator 302 for the state S4 of the digital pulse signal DPS2 has one or more values, none of which are the same as one or more values of the parameter level sent to the digital signal processor of the source generator 302 for the state S2 of the digital pulse signal DPS2. The parameter level sent to the digital signal processor of the source generator 302 for the state S4 of the digital pulse signal DPS2 has one or more values, none of which are the same as one or more values of the parameter level sent to the digital signal processor of the source generator 302 for the state S1 of the digital pulse signal DPS2.

As another example, the parameter level sent to the digital signal processor of the bias generator 304 for the state S2 of the digital pulse signal DPS2 has one or more values, none of which are the same as one or more values of the parameter level sent to the digital signal processor of the bias generator 304 for the state S1 of the digital pulse signal DPS2. Moreover, the parameter level sent to the digital signal processor of the bias generator 304 for the state S3 of the digital pulse signal DPS2 has one or more values, none of which are the same as one or more values of the parameter level sent to the digital signal processor of the bias generator 304 for the state S2 of the digital pulse signal DPS2. Also, the parameter level sent to the digital signal processor of the bias generator 304 for the state S3 of the digital pulse signal DPS2 has one or more values, none of which are the same as one or more values of the parameter level sent to the digital signal processor of the bias generator 304 for the state S1 of the digital pulse signal DPS2. The parameter level sent to the digital signal processor of the bias generator 304 for the state S4 of the digital pulse signal DPS2 has one or more values, none of which are the same as one or more values of the parameter level sent to the digital signal processor of the bias generator 304 for the state S3 of the digital pulse signal DPS2. Also, the parameter level sent to the digital signal processor of the bias generator 304 for the state S4 of the digital pulse signal DPS2 has one or more values, none of which are the same as one or more values of the parameter level sent to the digital signal processor of the bias generator 304 for the state S2 of the digital pulse signal DPS2. The parameter level sent to the digital signal processor of the bias generator 304 for the state S4 of the digital pulse signal DPS2 has one or more values, none of which are the same as one or more values of the parameter level sent to the digital signal processor of the bias generator 304 for the state S1 of the digital pulse signal DPS2.

In various embodiments, instead of the multiple frequency controllers FCS1S, FCS2S, FCS3S, and FCS4S of the source generator 302, one frequency controller is used to control the source RF power supply of the source generator 302 to generate a single frequency level of an RF signal instead of the multiple frequency levels for the states S1 through S4. The single frequency level is described above with reference to the source generator 102. The processor of the host computer sends a value of the single frequency level of the RF signal to the digital signal processor of the source generator 302. Upon receiving the value of the single frequency level, regardless of whether the state of the digital pulse signal DPS2 is S1 or S2 or S3 or S4, the digital signal processor of the source generator 302 sends the value to the frequency controller for storage in a memory device of the frequency controller. Moreover, upon receiving the value of the single frequency level, regardless of whether the state of the digital pulse signal DPS2 is S1 or S2 or S3 or S4, the frequency controller sends the value to the driver system 306A. The driver system 306A generates a current signal based on the value of the single frequency level and provides the current to the source RF power supply of the source generator 302. Upon receiving the current signal, the source RF power supply of the source generator 302 generates the RF signal having the single frequency level and the multiple parameter levels for the states S1 through S4.

Similarly, in some embodiments, instead of the multiple frequency controllers FCS1B, FCS2B, FCS3B, and FCS4B of the bias generator 304, one frequency controller is used to control the bias RF power supply to generate a single frequency level of an RF signal instead of the multiple frequency levels for the states S1 through S4. The single frequency level is described above with reference to the bias generator 104. The processor of the host computer sends a value of the single frequency level of the RF signal to the digital signal processor of the bias generator 304. Upon receiving the value of the single frequency level, regardless of whether the state of the digital pulse signal DPS2 is S1 or S2 or S3 or S4, the digital signal processor of the bias generator 304 sends the value to the frequency controller for storage in a memory device of the frequency controller. Moreover, upon receiving the value of the single frequency level, regardless of whether the state of the digital pulse signal DPS2 is S1 or S2 or S3 or S4, the frequency controller sends the value to the driver system 306B. The driver system 306B generates a current signal based on the value of the single frequency level and provides the current to the bias RF power supply of the bias generator 304. Upon receiving the current signal, the bias RF power supply of the bias generator 304 generates the RF signal having the single frequency level and the multiple parameter levels for the states S1 through S4 of the digital pulse signal DPS2.

In various embodiments, one or more functions described herein as being performed by the processor of the host computer are instead performed by the digital signal processor of the source generator 302. For example, instead of the processor of the host computer providing the parameter levels and the frequency levels for the states S1 through S4 to the digital signal processor of the source generator 302, the parameter levels and the frequency levels are stored in a memory device coupled the digital signal processor of the source generator 302 and are accessed by the digital signal processor of the source generator 302 from the memory device and sent to the parameter controllers PRS1S, PRS2S, PRS3S, and PRS4S and to the frequency controllers FCS1S, FCS2S, FCS3S, and FCS4S based on whether the state of the digital pulse signal DPS2 received from the processor of the host computer is S1, S2, S3, or S4. As another example, instead of the digital pulse signal DPS2 being generated by the processor of the host computer, the digital pulse signal DPS2 is generated by the digital signal processor of the source generator 302 and sent to the digital signal processor of the bias generator 304 via a transfer cable that couples the two digital signal processors of the source and bias generators 302 and 304. As yet another example, instead of the processor of the host computer providing the parameter levels and the frequency levels for the states S1 through S4 to the digital signal processor of the bias generator 304, the parameter levels and the frequency levels are stored in a memory device coupled the digital signal processor of the bias generator 304 and are accessed by the digital signal processor of the bias generator 104 from the memory device and sent to the parameter controllers PRS1B, PRS2B, PRS3B, and PRS4B and to the frequency controllers FCS1B, FCS2B, FCS3B, and FCS4B based on whether the state of the digital pulse signal DPS2 received from the processor of the host computer is S1, S2, S3, or S4. As another example, instead of the digital pulse signal DPS2 being generated by the processor of the host computer, the digital pulse signal DPS2 is generated by the digital signal processor of the bias generator 304 and sent to the source generator 302 via the transfer cable that couples the two digital signal processors of the source and bias generators 302 and 304.

Figure 3B:
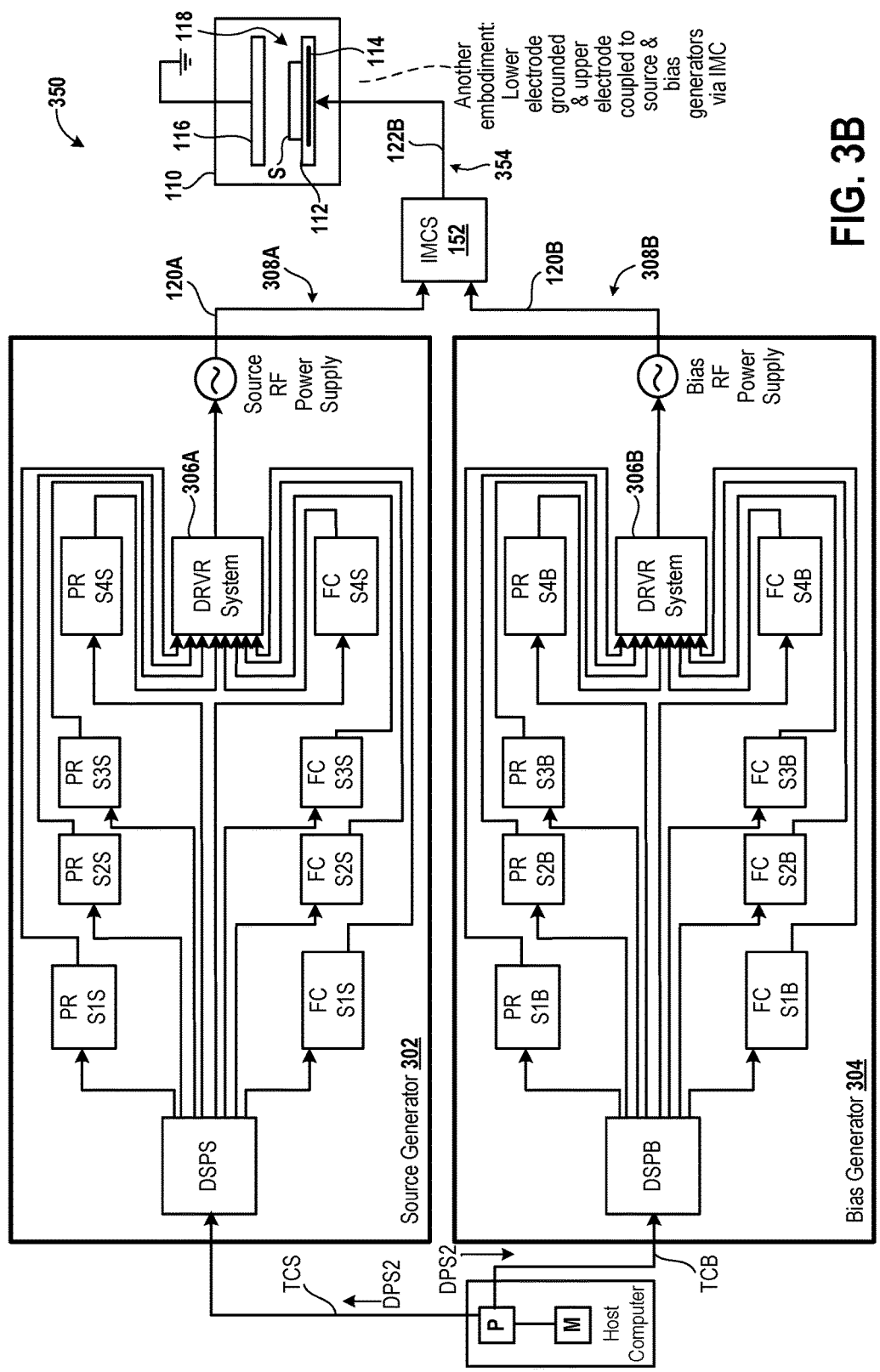
FIG. 3B is a diagram of an embodiment of another system to illustrate generation of four states to achieve a high aspect ratio dielectric etch.

FIG. 3B is a diagram of an embodiment of a system 350 to illustrate generation of four states to achieve a high aspect ratio dielectric etch. The system 350 includes the source generator 302, the bias generator 304, the host computer, the RF cables 120A and 120B, an impedance matching circuit IMC 152, the RF transmission line 122B, and the plasma chamber 110. The system 350 is the same as the system 150 of FIG. 1B except that in the system 350, the four-state source and bias generators 302 and 304 are used instead of the three-state source and bias generators 102 and 104. A source coupled to the multiple inputs of the impedance matching circuit IMC 152 includes the RF cables 120A and 120B and the source and bias generators 302 and 304.

The impedance matching circuit IMC 152 receives the RF signal 308A generated by the source generator 302 and the RF signal 308B generated by the bias generator 304, and matches an impedance of the load coupled to the output of the impedance matching circuit IMC 152 to an impedance of the source coupled to the inputs of the impedance matching circuit IMC 152 to generate a modified RF signal 354. For example, the impedance matching circuit IMC 152 matches an impedance of the RF transmission line 122B and the plasma chamber 110 with an impedance of the RF cables 120A and 120B, the source generator 302, and the bias generator 304. The lower electrode 112 receives the modified RF signal 354 to control processing of the substrate S. When the one or more process gases are supplied to the plasma chamber 110 with the modified RF signal 354, plasma is stricken or maintained within the gap 118 of the plasma chamber 110 to process the substrate S. The processing of the substrate S is controlled, for example, by including a parameter level of the RF signal 308A for the state S2 and by including a parameter level of the RF signal 308B for the state S2. During the state S2, the RF signal 308A has a parameter level and the RF signal 308B has a parameter level for generating plasma ions that sputter the mask material of the substrate S downward to protect the substrate layer of the substrate S.

In various embodiments, instead of the upper electrode 116 being coupled to the ground potential, the lower electrode 112 is coupled to the ground potential and the upper electrode 106 is coupled to the RF transmission line 122B to receive the modified RF signal 354.

In various embodiments, one or more functions described herein as being performed by the digital signal processor of the source generator 302 and the controllers PRS1S, PRS2S, PRS3S, PRS4S, FCS1S, FCS2S, FCS3S and FCS4S of the source generator 302 are instead performed by the processor of the host computer. For example, the processor of the host computer is coupled to the driver system 306A without being coupled to the digital signal processor of the source generator 302. The functions described herein as being performed by the digital signal processor of the source generator 302 and the controllers PRS1S, PRS2S, PRS3S, PRS4S, FCS1S, FCS2S, FCS3S and FCS4S of the source generator 302 are computer programs or computer modules that are executed by the processor of the host computer.

Similarly, in some embodiments, one or more functions described herein as being performed by the digital signal processor of the bias generator 304 and the controllers PRS1B, PRS2B, PRS3B, PRS4B, FCS1B, FCS2B, FCS3B and FCS4B of the bias generator 304 are instead performed by the processor of the host computer. For example, the processor of the host computer is coupled to the driver system 306B without being coupled to the digital signal processor of the bias generator 304. The functions described herein as being performed by the digital signal processor of the bias generator 304 and the controllers PRS1B, PRS2B, PRS3B, PRS4B, FCS1B, FCS2B, FCS3B and FCS4B of the bias generator 304 are computer programs or computer modules that are executed by the processor of the host computer.

In various embodiments, one or more functions described herein as being performed by the controllers PRS1S, PRS2S, PRS3S, PRS4S, FCS1S, FCS2S, FCS3S and FCS4S of the source generator 302 are instead performed by the digital signal processor of the source generator 302. For example, the digital signal processor of the source generator 302 is coupled to the driver system 306A without being coupled to the controllers PRS1S, PRS2S, PRS3S, PRS4S, FCS1S, FCS2S, FCS3S and FCS4S of the source generator 302. The functions described herein as being performed by the controllers PRS1S, PRS2S, PRS3S, PRS4S, FCS1S, FCS2S, FCS3S and FCS4S of the source generator 302 are computer programs or computer modules that are executed by the digital signal processor of the source generator 302.

Similarly, in some embodiments, one or more functions described herein as being performed by the controllers PRS1B, PRS2B, PRS3B, PRS4B, FCS1B, FCS2B, FCS3B and FCS4B of the bias generator 304 are instead performed by the digital signal processor of the bias generator 304. For example, the digital signal processor of the bias generator 304 is coupled to the driver system 306B without being coupled to the controllers PRS1B, PRS2B, PRS3B, PRS4B, FCS1B, FCS2B, FCS3B and FCS4B of the bias generator 304. The functions described herein as being performed by the controllers PRS1B, PRS2B, PRS3B, PRS4B, FCS1B, FCS2B, FCS3B and FCS4B of the bias generator 304 are computer programs or computer modules that are executed by the digital signal processor of the bias generator 304.

In various embodiments, one or more functions described herein as being performed by the digital signal processor of the source generator 302, the controllers PRS1S, PRS2S, PRS3S, and PRS4S of the source generator 302, and the controller that is used to generate the single frequency level of the source generator 302 are instead performed by the processor of the host computer. For example, the processor of the host computer is coupled to the driver system 306A without being coupled to the digital signal processor of the source generator 302. The functions described herein as being performed by the digital signal processor of the source generator 302, the controllers PRS1S, PRS2S, PRS3S, and PRS4S of the source generator 302, and the controller that is used to generate the single frequency level of the source generator 302 are computer programs or computer modules that are executed by the processor of the host computer.

Similarly, in some embodiments, one or more functions described herein as being performed by the digital signal processor of the bias generator 304, the controllers PRS1B, PRS2B, PRS3B, and PRS4B of the bias generator 304, and the controller that is used to generate the single frequency level of the bias generator 304 are instead performed by the processor of the host computer. For example, the processor of the host computer is coupled to the driver system 306B without being coupled to the digital signal processor of the bias generator 304. The functions described herein as being performed by the digital signal processor of the bias generator 304, the controllers PRS1B, PRS2B, PRS3B, and PRS4B of the bias generator 104, and the controller that is used to generate the single frequency level of the bias generator 304 are computer programs or computer modules that are executed by the processor of the host computer.

In various embodiments, one or more functions described herein as being performed by the controllers PRS1S, PRS2S, PRS3S, and PRS4S of the source generator 302 and the controller that is used to generate the single frequency level of the source generator 302 are instead performed by the digital signal processor of the source generator 302. For example, the digital signal processor of the source generator 302 is coupled to the driver system 306A without being coupled to the controllers PRS1S, PRS2S, PRS3S, and PRS4S of the source generator 302 and without being coupled to the controller that is used to generate the single frequency level of the source generator 302. The functions described herein as being performed by the controllers PRS1S, PRS2S, PRS3S, and PRS4S of the source generator 302 and the controller that is used to generate the single frequency level of the source generator 302 are computer programs or computer modules that are executed by the digital signal processor of the source generator 302.

Similarly, in some embodiments, one or more functions described herein as being performed by the controllers PRS1B, PRS2B, PRS3B, and PRS4B of the bias generator 304 and the controller that is used to generate the single frequency level of the bias generator 304 are instead performed by the digital signal processor of the bias generator 304. For example, the digital signal processor of the bias generator 304 is coupled to the driver system 306B without being coupled to the controllers PRS1B, PRS2B, PRS3B, and PRS4B of the bias generator 304 and without being coupled to the controller that is used to generate the single frequency level of the bias generator 304. The functions described herein as being performed by the controllers PRS1B, PRS2B, PRS3B, and PRS4B of the bias generator 304 and the controller that is used to generate the single frequency level of the bias generator 304 are computer programs or computer modules that are executed by the digital signal processor of the bias generator 304.

Figure 4A:
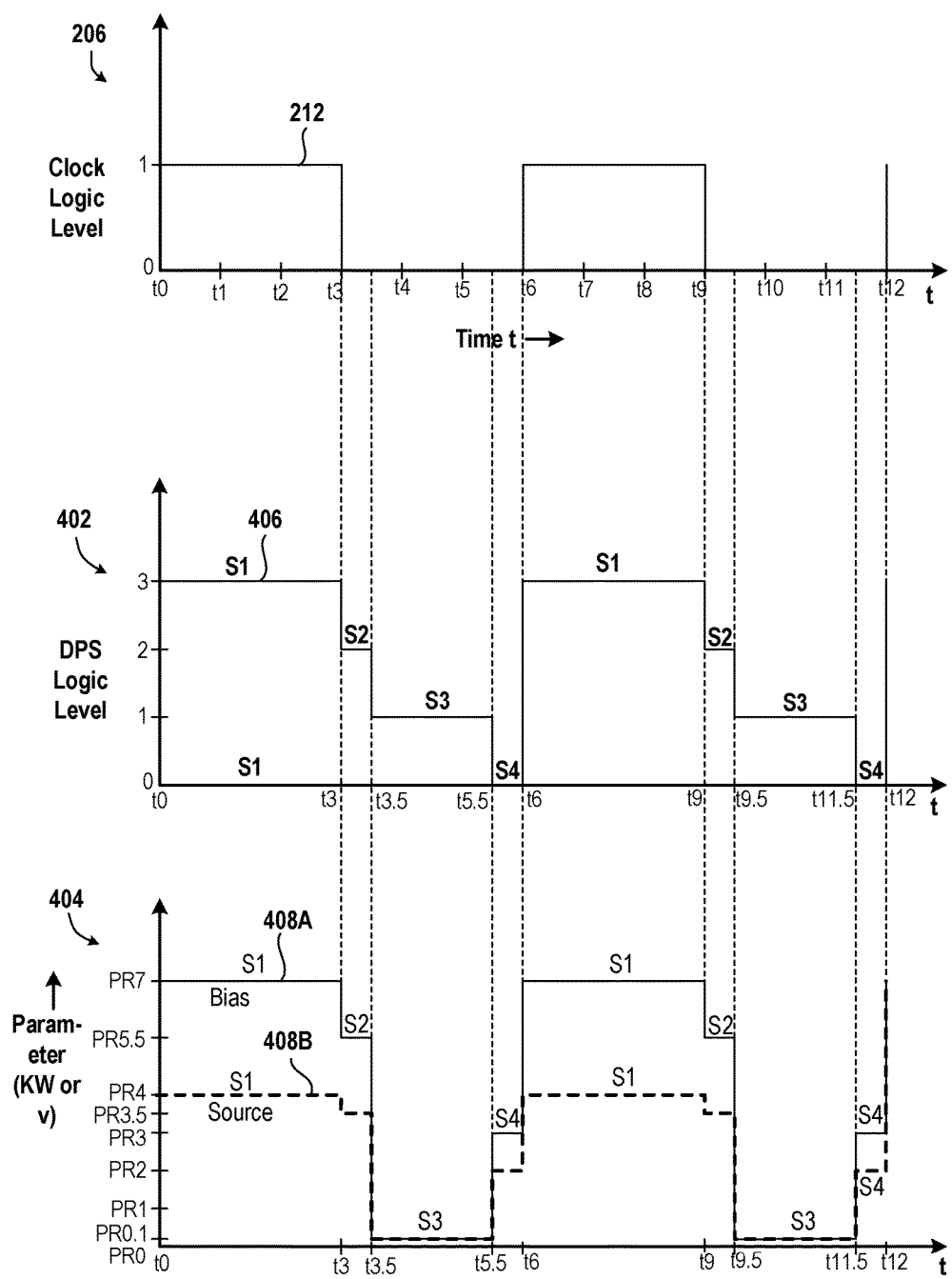
FIG. 4A shows embodiments of multiple graphs to illustrate a parameter of an RF signal generated by a bias generator of FIGS. 3A and 3B and a parameter of another RF signal generated by a source generator of FIGS. 3A and 3B.

FIG. 4A shows embodiments of the graph 206 and of additional graphs 402 and 404 to illustrate a parameter 408A of the RF signal 308B generated by the bias generator 304 of FIGS. 3A and 3B and a parameter 408B of the RF signal 308A generated by the source generator 302 of FIGS. 3A and 3B. The graph 404 plots the parameters 408A and 408B versus time t and the graph 402 plots a logic level of a digital pulse signal 406 versus the time t. The digital pulse signal 406 is an example of the digital pulse signal DPS2 of FIG. 3A.

The digital pulse signal 402 transitions from a logic level 0 to a logic level 3 at the time t0 and is at the logic level 3 for an occurrence of the state S1, which is time period between the time t0 and the time t3. The digital pulse signal 402 transitions from the logic level 3 to the logic level 2 at the time t3 and remains at the logic level 2 for an occurrence of the state S2, which is the time period between the time t3 and a time t3.5. The digital pulse signal 402 transitions from the logic level 2 to the logic level 1 at the time t3.5 and remains at the logic level 1 for an occurrence of the state S3, which is a time period between the time t3.5 and the time t5.5. The digital pulse signal 402 transitions from the logic level 1 to the logic level 0 at the time t5.5 and remains at the logic level 0 for an occurrence of the state S4, which is a time period between the time t5.5 and the time t6.

The digital pulse signal 402 transitions from the logic level 0 to the logic level 3 at the time t6 and is at the logic level 3 for another occurrence of the state S1, which is a time period between the time t6 and the time t9. The digital pulse signal 210 transitions from the logic level 3 to the logic level 2 at the time t9 and remains at the logic level 2 for another occurrence of the state S2, which is time period between the time t9 and a time t9.5. The digital pulse signal 402 transitions from the logic level 2 to the logic level 1 at the time t9.5 and remains at the logic level 1 for another occurrence of the state S3, which is a time period between the time t9.5 and the time t11.5. The digital pulse signal 402 transitions from the logic level 1 to the logic level 0 at the time t11.5 and remains at the logic level 0 for another occurrence of the state S4, which is a time period between the time t11.5 and the time t12. The digital pulse signal 402 transitions from the logic level 0 to the logic level 3 at the time t12.

It should be noted that during the time period between the time t3 and t0, the digital pulse signal 406 provides an occurrence of the state S1, during the time period between the times t3 and t3.5, the digital pulse signal 406 provides an occurrence of the state S2, during the time period between the times t3.5 and t5.5, the digital pulse signal 406 provides an occurrence of the state S3, and during the time period between the times t5.5 and t6, the digital pulse signal 406 provides an occurrence of the state S4. Similarly, during the time period between the time t6 and t9, the digital pulse signal 406 provides another occurrence of the state S1, during the time period between the times t9 and t9.5, the digital pulse signal 406 provides another occurrence of the state S2, during the time period between the times t9.5 and t11.5, the digital pulse signal 406 provides another occurrence of the state S3, and during the time period between the times t11.5 and t12, the digital pulse signal 406 provides another occurrence of the state S4.

The parameter 408A is at the parameter level PR7 during the time period between t0 and t3 for which the digital pulse signal 406 has the state S1. The parameter 408A transitions from the parameter level PR7 to a parameter level PR5.5 substantially at the time t3 and remains at the parameter level PR5.5 during the time period between t3 and t3.5 for which the digital pulse signal 406 has the state S2. The parameter 408A transitions from the parameter level PR5.5 to the parameter level PR0.1 substantially at the time t3.5 and remains at the parameter level PR0.1 for the time period between the times t3.5 and t5.5 for which the digital pulse signal 406 has the state S3. The parameter 408A transitions from the parameter level PR0.1 to the parameter level PR3 substantially at the time t5.5 and remains at the parameter level PR3 for the time period between the times t5.5 and t6 for which the digital pulse signal 406 has the state S4.

The parameter 408A transitions from the parameter level PR3 to the parameter level PR7 substantially at the time t6 and remains at the parameter level PR7 for the time period between the times t6 and t9 for which the digital pulse signal 406 has the state S1. The parameter 408A transitions from the parameter level PR7 to the parameter level PR5.5 substantially at the time t9 and remains at the parameter level PR5.5 during the time period between t9 and t9.5 for which the digital pulse signal 406 has the state S2. The parameter 408A transitions from the parameter level PR5.5 to the parameter level PR0.1 substantially at the time t9.5 and remains at the parameter level PR0.1 for the time period between the time t9.5 and t11.5 for which the digital pulse signal 406 has the state S3. The parameter 408A transitions from the parameter level PR0.1 to the parameter level PR3 substantially at the time t11.5 and remains at the parameter level PR3 for the time period between the time t11.5 and t12 for which the digital pulse signal 406 has the state S4. The parameter 408A transitions from the parameter level PR3 to the parameter level PR7 substantially at the time t12.

The parameter 408B is at the parameter level PR4 during the time period between t0 and t3 for which the digital pulse signal 406 has the state S1. The parameter 408B transitions from the parameter level PR4 to a parameter level PR3.5 substantially at the time t3 and remains at the parameter level PR3.5 during the time period between t3 and t3.5 for which the digital pulse signal 406 has the state S2. The parameter 408B transitions from the parameter level PR3.5 to the parameter level PR0.1 substantially at the time t3.5 and remains at the parameter level PR0.1 for the time period between the times t3.5 and t5.5 for which the digital pulse signal 406 has the state S3. The parameter 408B transitions from the parameter level PR0.1 to the parameter level PR2 substantially at the time t5.5 and remains at the parameter level PR2 for the time period between the times t5.5 and t6 for which the digital pulse signal 406 has the state S4.

The parameter 408B transitions from the parameter level PR2 to the parameter level PR4 substantially at the time t6 and remains at the parameter level PR4 for the time period between the times t6 and t9 for which the digital pulse signal 406 has the state S1. The parameter 408B transitions from the parameter level PR4 to the parameter level PR3.5 substantially at the time t9 and remains at the parameter level PR3.5 during the time period between t9 and t9.5 for which the digital pulse signal 406 has the state S2. The parameter 408B transitions from the parameter level PR3.5 to the parameter level PR0.1 substantially at the time t9.5 and remains at the parameter level PR0.1 for the time period between the time t9.5 and t11.5 for which the digital pulse signal 406 has the state S3. The parameter 408B transitions from the parameter level PR0.1 to the parameter level PR2 substantially at the time t11.5 and remains at the parameter level PR2 for the time period between the times t11.5 and t12 for which the digital pulse signal 406 has the state S4. The parameter 408B transitions from the parameter level PR2 to the parameter level PR4 substantially at the time t12.

It should further be noted that the parameter level PR3.5 is greater than the parameter level PR3 and less than the parameter level PR4. Also, the parameter level PR5.5 is greater than the parameter level PR5 and less than the parameter level PR6.

In various embodiments, the parameter 408A transitions from the parameter PR7 to another parameter level, such as between the parameter levels PR3 and PR7, substantially at the time t3 or substantially at the time t9 and remains at the other parameter level during the state S2. Also, the parameter 408A transitions from the parameter PR5.5 to another parameter level, between the parameter levels PR0.1 and PR3 or to the parameter level PR0, substantially at the time t3.5 or substantially at the time t9.5 and remains at the other parameter level during the state S3. The parameter 408A transitions from the parameter PR0.1 to another parameter level, between the parameter levels PR0.1 and PR5.5, substantially at the time t5.5 or substantially at the time t11.5 and remains at the other parameter level during the state S4.

In some embodiments, the parameter 408B transitions from the parameter PR4 to another parameter level, between the parameter levels PR2 and PR4, substantially at the time t3 or substantially at the time t9 and remains at the other parameter level during the state S2. Also, the parameter 408B transitions from the parameter PR3.5 to another parameter level, between the parameter levels PR0.1 and PR2 or to the parameter level PR0, substantially at the time t3.5 or substantially at the time t9.5 and remains at the other parameter level during the state S3. The parameter 408B transitions from the parameter PR0.1 to another parameter level, between the parameter levels PR0.1 and PR3.5, substantially at the time t5.5 or substantially at the time t11.5 and remains at the other parameter level during the state S4.

In some embodiments, the processor of the host computer modifies the digital pulse signal 406 to change a duration of the state S2 of the digital pulse signal 406 and/or change a duration of the state S3 of the digital pulse signal 406. For example, the processor of the host computer modifies the digital pulse signal 406 to have the logic level 2 for a time period that is greater than or lower than the time period between the times t3 and t3.5. As another example, the processor of the host computer modifies the digital pulse signal 406 to have the logic level 1 for a time period that is greater than or lower than the time period between the times t3.5 and t5.5. As another illustration, the duration for which the digital pulse signal DPS2 has the states S2 and S3 is at most 30% of the time period between the times t0 and t6. To further illustrate, the duration for which the digital pulse signal DPS2 has the states S2 and S3 ranges from and including 1% to 30% of the time period between the times t0 and t6. As another illustration, the duration for which the digital pulse signal DPS2 has the states S2 and S3 ranges from and including 1% to 20% of the time period between the times t0 and t6.

Figure 4B:
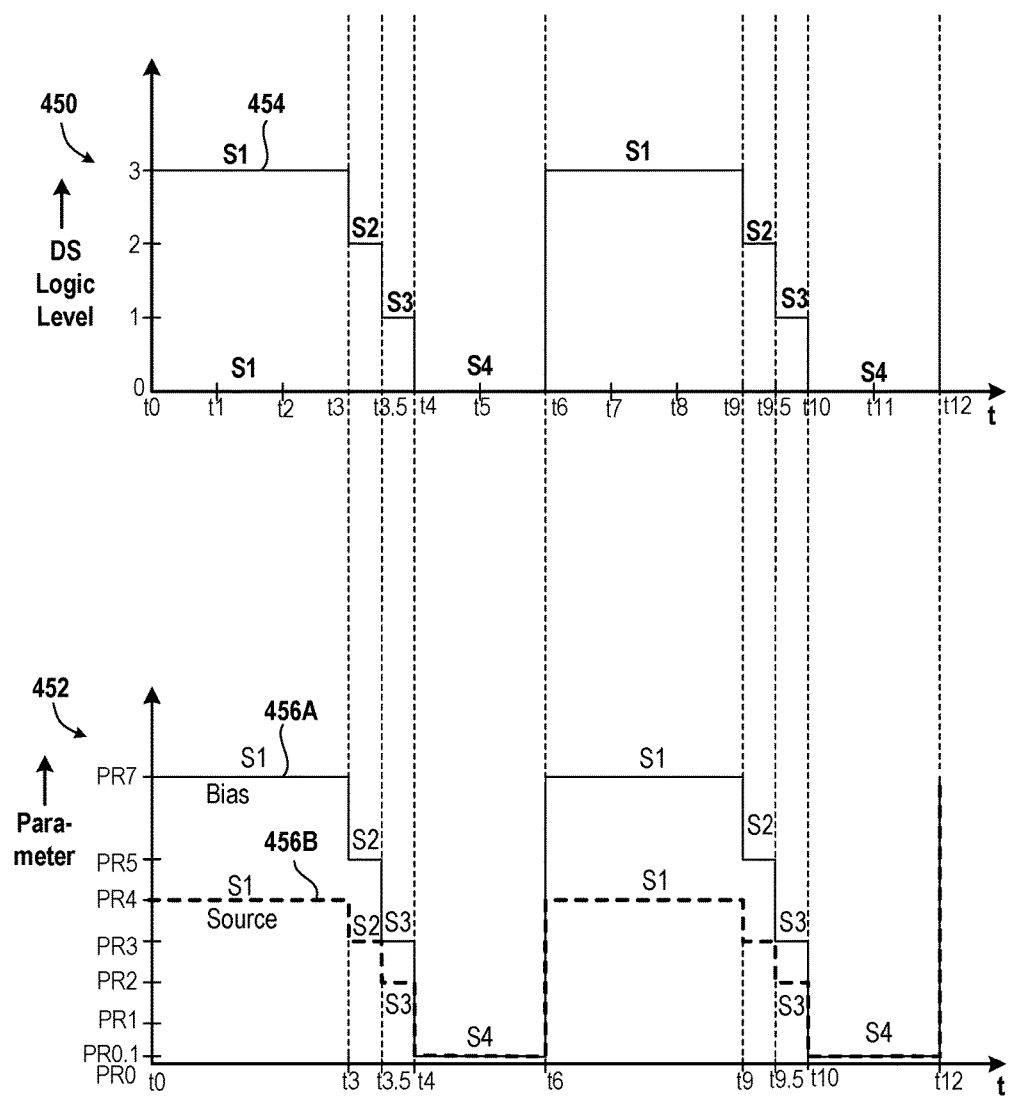
FIG. 4B shows embodiments of multiple graphs to illustrate a parameter of the RF signal generated by the bias generator of FIGS. 3A and 3B and another parameter of the RF signal generated by the source generator of FIGS. 3A and 3B.

FIG. 4B is an embodiment of a graph 450 to illustrate another digital pulse signal 454 and an embodiment of a graph 452 to illustrate a parameter 456A of the RF signal 308B generated by the bias generator 304 of FIGS. 3A and 3B and another parameter 456B of the RF signal 308A generated by the source generator 302 of FIGS. 3A and 3B. The graph 450 plots a logic level of the digital pulse signal 454 versus the time t. The digital pulse signal 454 is an example of the digital pulse signal DPS2 of FIGS. 3A and 3B. The graph 452 plots the parameters 456A and 456B versus the time t. The parameter 456A is synchronized to the clock signal 212 of FIG. 4A and to the digital pulse signal 454. Similarly, the parameter 456B is synchronized to the clock signal 212 of FIG. 4A and to the digital pulse signal 454.

The digital pulse signal 454 transitions from the logic level 0 to the logic level 3 at the time t0 and is at the logic level 3 for an occurrence of the state S1, which is the time period between the time t0 and the time t3, of the digital pulse signal DPS2. The digital pulse signal 454 transitions from the logic level 3 to the logic level 2 at the time t3 and remains at the logic level 2 for an occurrence of the state S2, which is the time period between the time t3 and the time t3.5, of the digital pulse signal DPS2. The digital pulse signal 454 transitions from the logic level 2 to the logic level 1 at the time t3.5 and remains at the logic level 1 for an occurrence of the state S3, which is a time period between the time t3.5 and a time t4, of the digital pulse signal DPS2. The digital pulse signal 454 transitions from the logic level 1 to the logic level 0 at the time t4 and remains at the logic level 0 for an occurrence of the state S4, which is a time period between the times t4 and t6, of the digital pulse signal DPS2.

The digital pulse signal 454 transitions from the logic level 0 to the logic level 3 at the time t6 and is at the logic level 3 for another occurrence of the state S1, which is a time period between the time t6 and the time t9, of the digital pulse signal DPS2. The digital pulse signal 454 transitions from the logic level 3 to the logic level 2 at the time t9 and remains at the logic level 2 for another occurrence of the state S2, which is time period between the time t9 and a time t9.5, of the digital pulse signal DPS2. The digital pulse signal 454 transitions from the logic level 2 to the logic level 1 at the time t9.5 and remains at the logic level 1 for another occurrence of the state S3, which is a time period between the time t9.5 and the time t10, of the digital pulse signal DPS2. The digital pulse signal 454 transitions from the logic level 1 to the logic level 0 at the time t10 and remains at the logic level 0 for another occurrence of the state S4, which is a time period between the time t10 and the time t12, of the digital pulse signal DPS2. The digital pulse signal 454 transitions from the logic level 0 to the logic level 3 at the time t12.

It should be noted that during the time period between the times t3 and t0, the digital pulse signal 454 provides an occurrence of the state S1, during the time period between the times t3 and t3.5, the digital pulse signal 454 provides an occurrence of the state S2, during the time period between the times t3.5 and t4, the digital pulse signal 454 provides an occurrence of the state S3, and during the time period between the times t4 and t6, the digital pulse signal 454 provides an occurrence of the state S4. Similarly, during the time period between the time t6 and t9, the digital pulse signal 454 provides another occurrence of the state S1, during the time period between the times t9 and t9.5, the digital pulse signal 454 provides another occurrence of the state S2, during the time period between the times t9.5 and t10, the digital pulse signal 454 provides another occurrence of the state S3, and during the time period between the times t10 and t12, the digital pulse signal 454 provides another occurrence of the state S4.

The parameter 456A is at the parameter level PR7 during the time period between t0 and t3 for which the digital pulse signal 454 has the state S1. The parameter 456A transitions from the parameter level PR7 to a parameter level PR5 substantially at the time t3 and remains at the parameter level PR5 during the time period between t3 and t3.5 for which the digital pulse signal 454 has the state S2. The parameter 456A transitions from the parameter level PR5 to the parameter level PR3 substantially at the time t3.5 and remains at the parameter level PR3 for the time period between the times t3.5 and t4 for which the digital pulse signal 454 has the state S3. The parameter 456A transitions from the parameter level PR3 to the parameter level PR0.1 substantially at the time t4 and remains at the parameter level PR0.1 for the time period between the times t4 and t6 for which the digital pulse signal 454 has the state S4.

The parameter 456A transitions from the parameter level PR0.1 to the parameter level PR7 substantially at the time t6 and remains at the parameter level PR7 for the time period between the times t6 and t9 for which the digital pulse signal 454 has the state S1. The parameter 456A transitions from the parameter level PR7 to the parameter level PR5 substantially at the time t9 and remains at the parameter level PR5 during the time period between t9 and t9.5 for which the digital pulse signal 454 has the state S2. The parameter 456A transitions from the parameter level PR5 to the parameter level PR3 substantially at the time t9.5 and remains at the parameter level PR3 for the time period between the time t9.5 and t10 for which the digital pulse signal 454 has the state S3. The parameter 456A transitions from the parameter level PR3 to the parameter level PR0.1 substantially at the time t10 and remains at the parameter level PR0.1 for the time period between the time t10 and t12 for which the digital pulse signal 454 has the state S4. The parameter 456A transitions from the parameter level PR0.1 to the parameter level PR7 substantially at the time t12.

The parameter 456B is at the parameter level PR4 during the time period between t0 and t3 for which the digital pulse signal 454 has the state S1. The parameter 456B transitions from the parameter level PR4 to the parameter level PR3 substantially at the time t3 and remains at the parameter level PR3 during the time period between t3 and t3.5 for which the digital pulse signal 454 has the state S2. The parameter 456B transitions from the parameter level PR3 to the parameter level PR2 substantially at the time t3.5 and remains at the parameter level PR2 for the time period between the times t3.5 and t4 for which the digital pulse signal 454 has the state S3. The parameter 456B transitions from the parameter level PR2 to the parameter level PR0.1 substantially at the time t4 and remains at the parameter level PR0.1 for the time period between the times t4 and t6 for which the digital pulse signal 454 has the state S4.

The parameter 456B transitions from the parameter level PR0.1 to the parameter level PR4 substantially at the time t6 and remains at the parameter level PR4 for the time period between the times t6 and t9 for which the digital pulse signal 454 has the state S1. The parameter 456B transitions from the parameter level PR4 to the parameter level PR3 substantially at the time t9 and remains at the parameter level PR3 during the time period between t9 and t9.5 for which the digital pulse signal 454 has the state S2. The parameter 456B transitions from the parameter level PR3 to the parameter level PR2 substantially at the time t9.5 and remains at the parameter level PR2 for the time period between the time t9.5 and t10 for which the digital pulse signal 454 has the state S3. The parameter 456B transitions from the parameter level PR2 to the parameter level PR0.1 substantially at the time t10 and remains at the parameter level PR0.1 for the time period between the times t10 and t12 for which the digital pulse signal 454 has the state S4. The parameter 456B transitions from the parameter level PR0.1 to the parameter level PR4 substantially at the time t12.

In various embodiments, the parameter 456A transitions from the parameter PR7 to another parameter level, such as between the parameter levels PR3 and PR7, substantially at the time t3 or substantially at the time t9 and remains at the other parameter level during the state S2 of the digital pulse signal 454. Also, the parameter 456A transitions from the parameter PR5 to another parameter level, between the parameter levels PR0.1 and PR5, substantially at the time t3.5 or substantially at the time t9.5 and remains at the other parameter level during the state S3 of the digital pulse signal 454. The parameter 456A transitions from the parameter PR3 to another parameter level, between the parameter levels PR0.1 and PR3 or to the parameter level PR0, substantially at the time t4 or substantially at the time t10 and remains at the other parameter level during the state S4.

In some embodiments, the parameter 456B transitions from the parameter PR4 to another parameter level, such as between the parameter levels PR2 and PR4, substantially at the time t3 or substantially at the time t9 and remains at the other parameter level during the state S2 of the digital pulse signal 454. Also, the parameter 456B transitions from the parameter PR3 to another parameter level, between the parameter levels PR0.1 and PR3, substantially at the time t3.5 or substantially at the time t9.5 and remains at the other parameter level during the state S3 of the digital pulse signal 454. The parameter 456B transitions from the parameter PR2 to another parameter level, between the parameter levels PR0.1 and PR2 or to the parameter level PR0, substantially at the time t4 or substantially at the time t10 and remains at the other parameter level during the state S4.

In some embodiments, the processor of the host computer modifies the digital pulse signal 454 to change a duration of the state S2 of the digital pulse signal 454 and/or change a duration of the state S3 of the digital pulse signal 454. For example, the processor of the host computer modifies the digital pulse signal 454 to have the logic level 2 for a time period that is greater than or lower than the time period between the times t3 and t3.5 and/or modifies the digital pulse signal 454 to have the logic level 1 for a time period that is greater than or lower than the time period between the times t3.5 and t4.

Figure 4C:
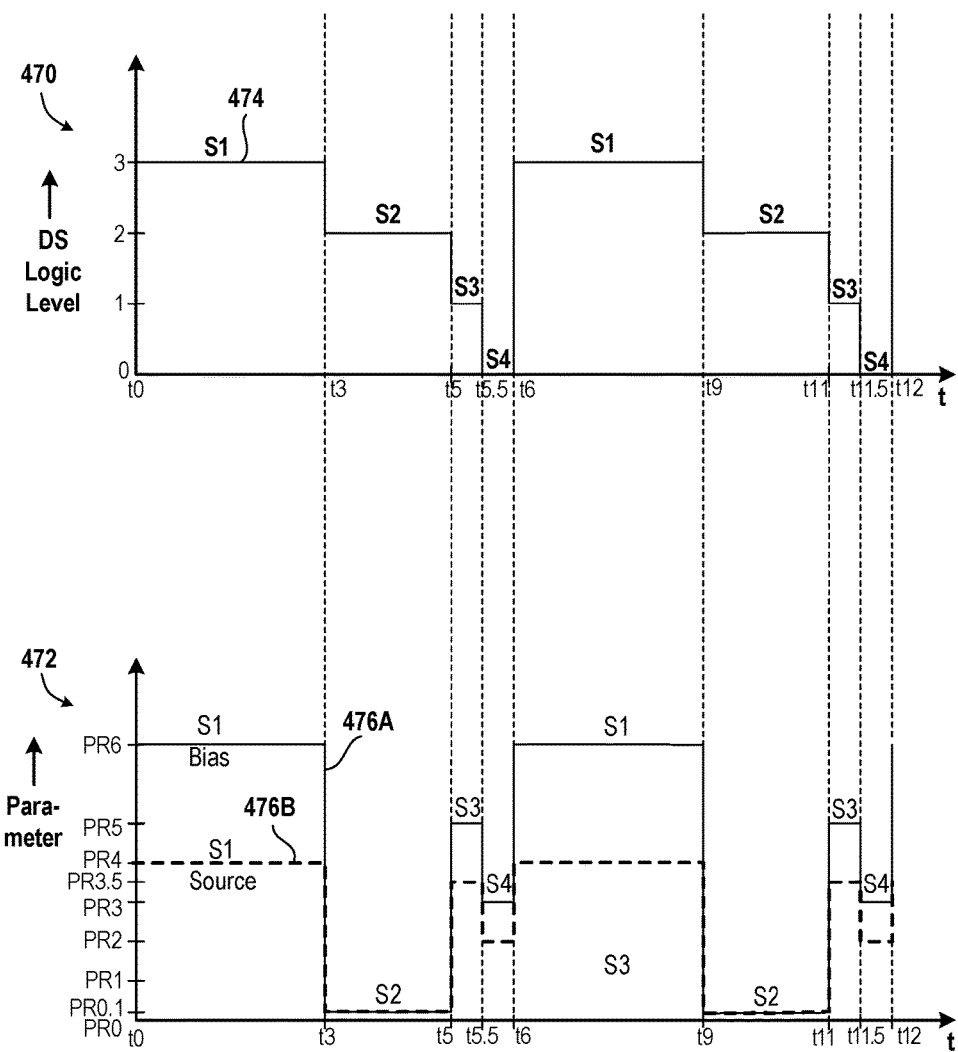
FIG. 4C is an embodiment of multiple graphs to illustrate a parameter of the RF signal generated by the bias generator of FIGS. 3A and 3B and another parameter of the RF signal generated by the source generator of FIGS. 3A and 3B.

FIG. 4C is an embodiment of a graph 470 to illustrate another digital pulse signal 474 and an embodiment of a graph 472 to illustrate a parameter 476A of the RF signal 308B generated by the bias generator 304 of FIGS. 3A and 3B and another parameter 476B of the RF signal 308A generated by the source generator 302 of FIGS. 3A and 3B. The graph 470 plots a logic level of the digital pulse signal 474 versus the time t. The digital pulse signal 474 is an example of the digital pulse signal DPS2 of FIGS. 3A and 3B. The graph 472 plots the parameters 476A and 476B versus the time t. The parameter 476A is synchronized to the clock signal 212 of FIG. 4A and to the digital pulse signal 474. Similarly, the parameter 476B is synchronized to the clock signal 212 of FIG. 4A and to the digital pulse signal 474.

The digital pulse signal 474 transitions from the logic level 0 to the logic level 3 at the time t0 and is at the logic level 3 for an occurrence of the state S1, which is the time period between the time t0 and the time t3. The digital pulse signal 474 transitions from the logic level 3 to the logic level 2 at the time t3 and remains at the logic level 2 for an occurrence of the state S2, which is the time period between the times t3 and t5. The digital pulse signal 474 transitions from the logic level 2 to the logic level 1 at the time t5 and remains at the logic level 1 for an occurrence of the state S3, which is a time period between the time t5 and the time t5.5. The digital pulse signal 474 transitions from the logic level 1 to the logic level 0 at the time t5.5 and remains at the logic level 0 for an occurrence of the state S4, which is a time period between the time t5.5 and the time t6.

The digital pulse signal 474 transitions from the logic level 0 to the logic level 3 at the time t6 and is at the logic level 3 for another occurrence of the state S1, which is a time period between the time t6 and the time t9. The digital pulse signal 474 transitions from the logic level 3 to the logic level 2 at the time t9 and remains at the logic level 2 for another occurrence of the state S2, which is time period between the time t9 and a time t11. The digital pulse signal 474 transitions from the logic level 2 to the logic level 1 at the time t11 and remains at the logic level 1 for another occurrence of the state S3, which is a time period between the time t11 and the time t11.5. The digital pulse signal 474 transitions from the logic level 1 to the logic level 0 at the time t11.5 and remains at the logic level 0 for another occurrence of the state S4, which is a time period between the time t11.5 and the time t12. The digital pulse signal 474 transitions from the logic level 0 to the logic level 3 at the time t12.

It should be noted that during the time period between the time t3 and t0, the digital pulse signal 474 provides an occurrence of the state S1, during the time period between the times t3 and t5, the digital pulse signal 474 provides an occurrence of the state S2, during the time period between the times t5 and t5.5, the digital pulse signal 474 provides an occurrence of the state S3, and during the time period between the times t5.5 and t6, the digital pulse signal 454 provides an occurrence of the state S4. Similarly, during the time period between the time t6 and t9, the digital pulse signal 474 provides another occurrence of the state S1, during the time period between the times t9 and t11, the digital pulse signal 474 provides another occurrence of the state S2, during the time period between the times t11 and t11.5, the digital pulse signal 474 provides another occurrence of the state S3, and during the time period between the times t11.5 and t12, the digital pulse signal 474 provides another occurrence of the state S4.

The parameter 476A is at the parameter level PR6 during the time period between t0 and t3 for which the digital pulse signal 474 has the state S1. The parameter 476A transitions from the parameter level PR6 to a parameter level PR0.1 substantially at the time t3 and remains at the parameter level PR0.1 during the time period between t3 and t5 for which the digital pulse signal 474 has the state S2. The parameter 476A transitions from the parameter level PR0.1 to the parameter level PR5 substantially at the time t5 and remains at the parameter level PR5 for the time period between the time t5 and t5.5 for which the digital pulse signal 474 has the state S3. The parameter 476A transitions from the parameter level PR5 to the parameter level PR3 substantially at the time t5.5 and remains at the parameter level PR3 for the time period between the times t5.5 and t6 for which the digital pulse signal 474 has the state S4.

The parameter 476A transitions from the parameter level PR3 to the parameter level PR6 substantially at the time t6 and remains at the parameter level PR6 for the time period between the times t6 and t9 for which the digital pulse signal 474 has the state S1. The parameter 476A transitions from the parameter level PR6 to the parameter level PR0.1 substantially at the time t9 and remains at the parameter level PR0.1 during the time period between t9 and t11 for which the digital pulse signal 474 has the state S2. The parameter 476A transitions from the parameter level PR0.1 to the parameter level PR5 substantially at the time t11 and remains at the parameter level PR5 for the time period between the time t11 and t11.5 for which the digital pulse signal 474 has the state S3. The parameter 476A transitions from the parameter level PR5 to the parameter level PR3 substantially at the time t11.5 and remains at the parameter level PR3 for the time period between the time t11.5 and t12 for which the digital pulse signal 474 has the state S4. The parameter 476A transitions from the parameter level PR3 to the parameter level PR6 substantially at the time t12.

The parameter 476B is at the parameter level PR4 during the time period between t0 and t3 for which the digital pulse signal 474 has the state S1. The parameter 476B transitions from the parameter level PR4 to the parameter level PR0.1 substantially at the time t3 and remains at the parameter level PR3 during the time period between t3 and t5 for which the digital pulse signal 474 has the state S2. The parameter 476B transitions from the parameter level PR0.1 to the parameter level PR3.5 substantially at the time t5 and remains at the parameter level PR3.5 for the time period between the times t5 and t5.5 for which the digital pulse signal 474 has the state S3. The parameter 476B transitions from the parameter level PR3.5 to the parameter level PR2 substantially at the time t5.5 and remains at the parameter level PR2 for the time period between the times t5.5 and t6 for which the digital pulse signal 474 has the state S4.

The parameter 476B transitions from the parameter level PR2 to the parameter level PR4 substantially at the time t6 and remains at the parameter level PR4 for the time period between the times t6 and t9 for which the digital pulse signal 474 has the state S1. The parameter 476B transitions from the parameter level PR4 to the parameter level PR0.1 substantially at the time t9 and remains at the parameter level PR0.1 during the time period between t9 and t11 for which the digital pulse signal 474 has the state S2. The parameter 476B transitions from the parameter level PR0.1 to the parameter level PR3.5 substantially at the time t11 and remains at the parameter level PR3.5 for the time period between the time t11 and t11.5 for which the digital pulse signal 474 has the state S3. The parameter 476B transitions from the parameter level PR3.5 to the parameter level PR2 substantially at the time t11.5 and remains at the parameter level PR2 for the time period between the times t11.5 and t12 for which the digital pulse signal 474 has the state S4. The parameter 476B transitions from the parameter level PR2 to the parameter level PR4 substantially at the time t12.

In various embodiments, the parameter 476A transitions from the parameter PR6 to another parameter level, such as between the parameter levels PR0.1 and PR3 or the parameter level PR0, substantially at the time t3 or substantially at the time t9 and remains at the other parameter level during the state S2. Also, the parameter 476A transitions from the parameter level PR0.1 to another parameter level, between the parameter levels PR3 and PR6, substantially at the time t5 or substantially at the time t11 and remains at the other parameter level during the state S3. The parameter 476A transitions from the parameter level PR5 to another parameter level, between the parameter levels PR0.1 and PR5, substantially at the time t5.5 or substantially at the time t11.5 and remains at the other parameter level during the state S4.

In some embodiments, the parameter 476B transitions from the parameter PR4 to another parameter level, such as between the parameter levels PR0.1 and PR2, substantially at the time t3 or substantially at the time t9 and remains at the other parameter level during the state S2. Also, the parameter 476B transitions from the parameter level PR0.1 to another parameter level, between the parameter levels PR2 and PR4, substantially at the time t5 or substantially at the time t11 and remains at the other parameter level during the state S3. The parameter 476B transitions from the parameter level PR3.5 to another parameter level, between the parameter levels PR0.1 and PR3.5, substantially at the time t5.5 or substantially at the time t11.5 and remains at the other parameter level during the state S4.

In some embodiments, the processor of the host computer modifies the digital pulse signal 474 to change a duration of the state S2 of the digital pulse signal 474 and/or change a duration of the state S3 of the digital pulse signal 474. For example, the processor of the host computer modifies the digital pulse signal 474 to have the logic level 2 for a time period that is greater than or lower than the time period between the times t3 and t5 and/or modifies the digital pulse signal 474 to have the logic level 1 for a time period that is greater than or lower than the time period between the times t5 and t5.5.

Figure 5B:
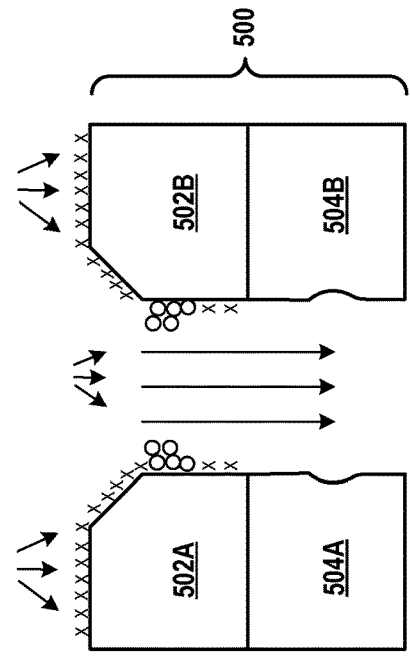
FIG. 5B is an embodiment of the substrate that is processed by applying the two-state pulsing.
Figure 5A:
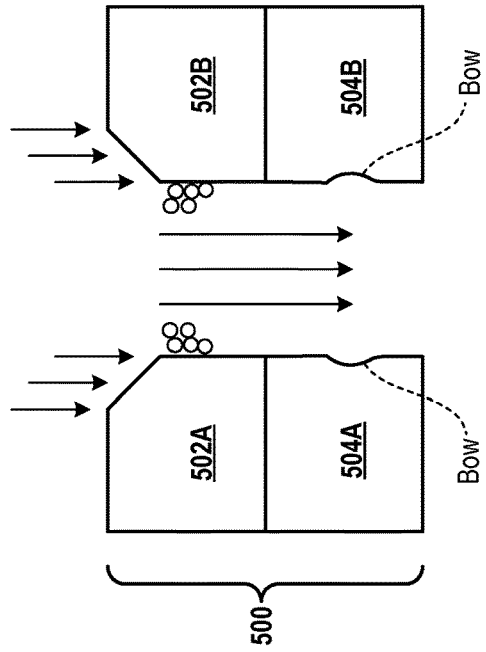
FIG. 5A is an embodiment of a substrate that is processed by applying two-state pulsing.

FIG. 5A is an embodiment of a substrate 500 that is processed by applying two-state pulsing. The substrate 550 is an example of the substrate S of FIGS. 1A, 1B, 3A, and 3B. The substrate 550 includes a portion 504A of a substrate layer and another portion 504B of the substrate layer. The substrate 550 further includes a portion 502A of a mask layer and a portion 502B of the mask layer. The mask layer is overlaid on top of the substrate layer.

In the two-state pulsing, during a first state, sputtering of the mask layer occurs and a material of the mask layer is deposited on the portions 502A and 502B to reduce a width of a neck between a vertical layer of the portion 502A and a vertical layer of the portion 502B. This deposition of the material of the mask layer on the mask layer is sometimes referred to herein as passivation. The material of the mask layer is illustrated as circles on FIG. 5A. Due to a reduction in the width of the neck, when plasma ions of plasma within the plasma chamber 110 are used to etch the substrate 500 during the first state, a bow is created at vertical layers of the portions 504A and 504B of the substrate layer.

FIG. 5B is an embodiment of the substrate 500 that is processed by applying the two-state pulsing. In the two-state pulsing, during a second state, a deposition material, such as copper or another metal or an oxide, is deposited on the mask layer. The deposition material that is deposited on the mask layer is illustrated as x's on the portions 502A and 502B.

FIG. 5C is an embodiment of the substrate 500 to illustrate an effect of the state S1 of the digital pulse signal DPS1 on the substrate 500. During the state S1 of the digital pulse signal DPS1 or DPS2, the substrate layer is etched by applying the RF signals 116A and 116B of FIGS. 1A and 1B. For example, a high aspect ratio etch is performed during the state S1 of the digital pulse signal DPS1. The high aspect ratio etch of the substrate 500 during the state S1 is an example of a dielectric etch operation. During the etching of the substrate layer, sputtering and deposition of particles of the mask layer occurs on top of the mask layer to reduce a width of a neck between the portions 502A and 502B. However, because the state S1 of the digital pulse signal DPS1 occurs for a smaller time period compared to the first state of the two-state pulsing, a lower amount of the particles of the mask layer are deposited on the mask layer.

FIG. 5D is an embodiment of the substrate 500 to illustrate an effect of the state S2 of the digital pulse signal DPS1 on the substrate 500. During the state S2 of the digital pulse signal DPS1 or the states S2 and S3 of the digital pulse signal DPS2, the particles of the mask layer that are deposited over of the mask layer are sputtered downwards by plasma within the plasma chamber 110. For example, there is sputtering of the particles of the mask layer that are deposited on top of the mask layer downward towards the substrate layer to increase a critical dimension of a neck of the mask layer and to facilitate an increase in neutral passivation at a location of any bow within the substrate layer. The increase in the critical dimension of the neck increases chances of a vertical etch and reduces chances of a lateral etch of the substrate layer. The increase in the neutral passivation at the location of the bow reduces chances of the bow being created within the substrate layer by any lateral etch. To illustrate, there is a 10% to 20% reduction in bow within the substrate layer when three or four-state pulsing, as described herein, is applied compared to when the two-state pulsing is applied to process the substrate 500. The reduction in the bow helps achieve a vertical profile of the substrate layer. As a result, there is minimal or no bow in the substrate layer.

FIG. 5E is an embodiment of the substrate 500 to illustrate an effect of the state S3 of the digital pulse signal DPS1 on the substrate 500. During the state S3 of the digital pulse signal DPS1, there is deposition of the particles of the deposition material on the mask layer. For example, during the state S3 of the digital pulse signal DPS1, there is direct ion deposition on the mask layer and there is reduction in sputter redeposition of the material of the mask layer at the neck of the mask layer. The deposition of the particles of the deposition material during the state S3 is an example of a deposition operation.

Because the particles of the mask layer are sputtered downwards from the mask layer to the substrate layer during the state S2 of the digital pulse signal DPS1 or the states S2 and S3 of the digital pulse signal DPS2, there is an increase in a width of the neck of the mask layer to increase an etch rate of etching the substrate layer during the state S1 and to increase selectivity of the substrate layer. The increase in the etch rate facilitates achieving the high aspect ratio dielectric etch.

Figure 6:
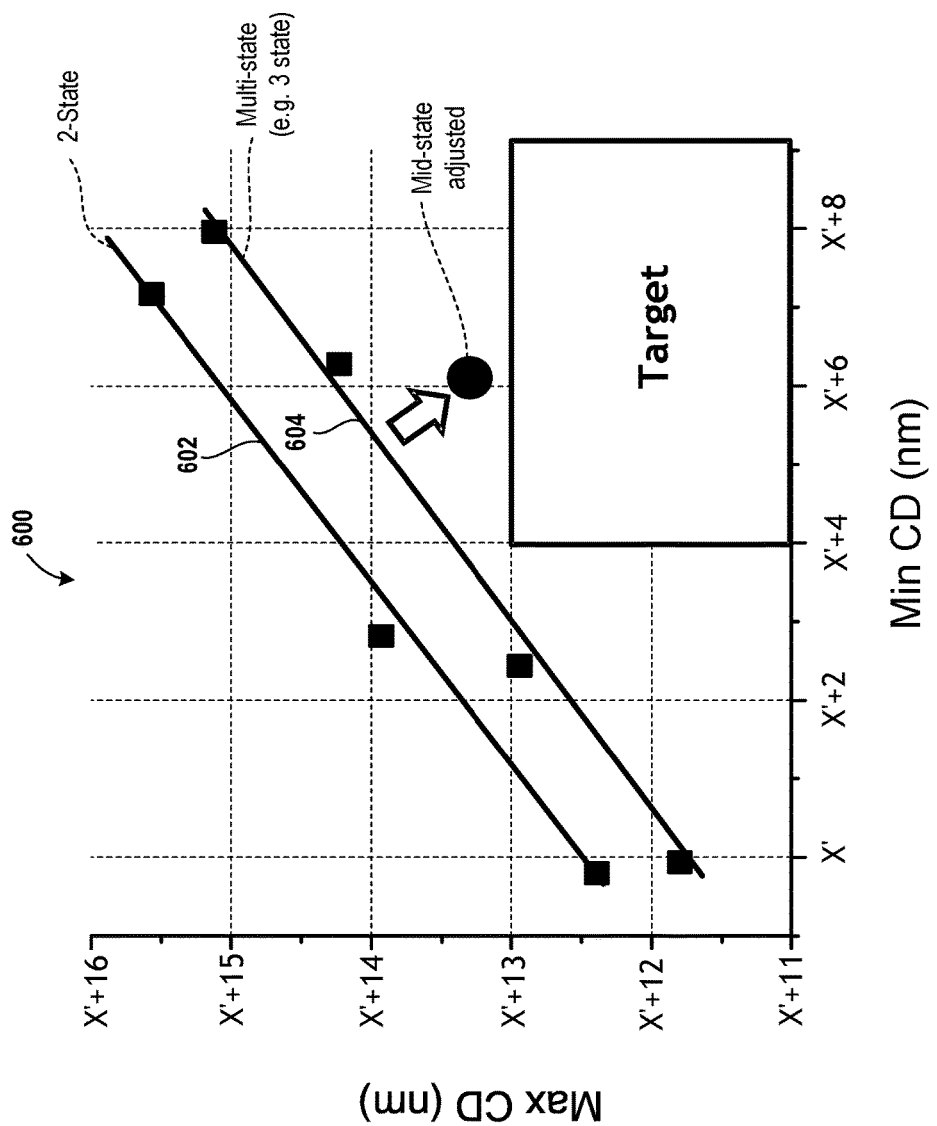
FIG. 6 is an embodiment of a graph to illustrate plots that plot a maximum critical dimension (CD) versus a minimum critical dimension.

FIG. 6 is an embodiment of a graph 600 to illustrate plots 602 and 604 that plot a maximum (max) critical dimension (CD) of any bow of the substrate layer versus a minimum (min) critical dimension of the bow. Each critical dimension is measured in nanometers (nm). The plot 602 plots the maximum CD on a y-axis versus the minimum CD on an x-axis when the two-state pulsing is applied to the plasma chamber 110 of FIGS. 1A, 1B, 3A, and 3B. Moreover, the plot 504 plots the maximum CD on the y-axis versus the minimum CD on the x-axis when multi-state pulsing, such as the three-state pulsing or four-state pulsing, is applied to the plasma chamber 110. Along the x-axis, there are numbers X', X'+2, X'+4, X'+6, and X'+8. It should be noted that X', as used herein, is a real number greater than or equal to 0. Also, along the y-axis, there are numbers X'+11, X'+12, X'+13, X'+14, X'+15, and X'+16.

In the three-state pulsing, the RF signals 116A and 116B of FIGS. 1A and 1B are generated and supplied. Moreover, in the four-state pulsing, the RF signals 308A and 308B of FIGS. 3A and 3B are generated and supplied. It should be noted that when the multi-state pulsing is applied, for the same amount of maximum CD, the minimum CD is increased and for the same amount of minimum CD, the maximum CD is reduced. A critical dimension, as described herein, of the bow of the substrate layer is a width of the bow of the substrate layer, such as a width between bows of the substrate portions 504A and 504B of FIGS. 5C through 5E. Similarly, a critical dimension, as described herein, of the mask layer is a width of the mask layer, such as a width between the substrate portions 502A and 502B of FIGS. 5C through 5E Moreover, a parameter level of the RF signal 116A during the state S2 of the digital pulse signal DPS1 and/or a parameter level of the RF signal 116B during the state S2 of the digital pulse signal DPS1 is adjusted, such as increased or decreased, to move the plot 604 further vertically down along the y-axis of the graph 600 to move the plot 604 closer to a target area. The parameter level of the RF signal 116A and/or the parameter level of the RF signal 116B are adjusted by the processor of the host computer. The processor of the host computer sends the adjustment in the parameter levels, such as an increase or decrease in the parameter level PR3 of the parameter 208A of FIG. 2A, an increase or decrease in the parameter level PR2 of the parameter 208B of FIG. 2A, an increase or decrease in the parameter level PR0.1 of the parameter 256A of FIG. 2B, an increase or decrease in the parameter level PR0.1 of the parameter 256B of FIG. 2B, etc., or the adjusted parameter levels to the digital signal processors of the source and bias generators 102 and 104 of FIGS. 1A and 1B to adjust the parameter levels.

Also, in case of the four-state pulsing, a parameter level of the RF signal 308A during the state S2 of the digital pulse signal DPS2, a parameter level of the RF signal 308B during the state S2 of the digital pulse signal DPS2, a parameter level of the RF signal 308A during the state S3 of the digital pulse signal DPS2 is adjusted, and/or a parameter level of the RF signal 308B during the state S3 of the digital pulse signal DPS2 is adjusted, such as increased or decreased, to move the plot 604 further vertically down along the y-axis of the graph 600 closer to the target area. The parameter level of the RF signal 308A and/or the parameter level of the RF signal 308B are adjusted by the processor of the host computer. The processor of the host computer sends the adjustment in the parameter levels, such as an increase or decrease in the parameter level PR5.5 of the parameter 408A of FIG. 4A, an increase or decrease in the parameter level PR3.5 of the parameter 408B of FIG. 4A, an increase or decrease in the parameter level PR0.1 of the parameter 408A of FIG. 4A, an increase or decrease in the parameter level PR0.1 of the parameter 408B of FIG. 4A, etc., or the adjusted parameter levels to the digital signal processors of the source and bias generators 302 and 304 of FIGS. 3A and 3B to adjust the parameter levels.

Other examples of the adjustment in the parameter levels include an increase or decrease in the parameter level PR5 of the parameter 456A of FIG. 4B, an increase or decrease in the parameter level PR3 of the parameter 456A, an increase or decrease in the parameter level PR3 of the parameter 456B, an increase or decrease in the parameter level PR2 of the parameter 456B, an increase or decrease in the parameter level PR0.1 of the parameter 476A, an increase or decrease in the parameter level PR5 of the parameter 476A, an increase or decrease in the parameter level PR4 of the parameter 476A, an increase or decrease in the parameter level PR0.1 of the parameter 476B, and an increase or decrease in the parameter level PR3.5 of the parameter 476B.

Figure 7A:
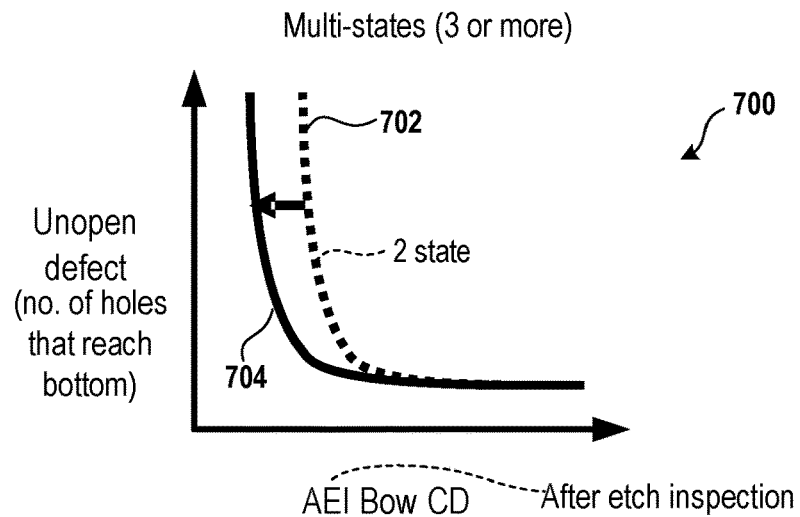
FIG. 7A is an embodiment of a graph to illustrate a plot of an unopen defect plotted on a y-axis versus an after etch inspection (AEI) bow CD plotted on an x-axis.

FIG. 7A is an embodiment of a graph 700 to illustrate a plot 702 of an unopen defect plotted on a y-axis versus an after etch inspection (AEI) bow CD plotted on an x-axis. The graph 700 also includes a plot 704. The plot 702 is generated when the two-state pulsing is applied and the plot 704 is generated when the multi-state pulsing is applied. An example of the unopen defect, as described herein, is a number of channels, such as holes, formed within the substrate S that reach a bottom of the substrate layer. When the multi-state pulsing is applied, for the same amount of holes that reach the bottom of the substrate layer, there is a reduction in a critical dimension of the bow of substrate layer after an etch operation is performed on the substrate S.

Figure 7B:
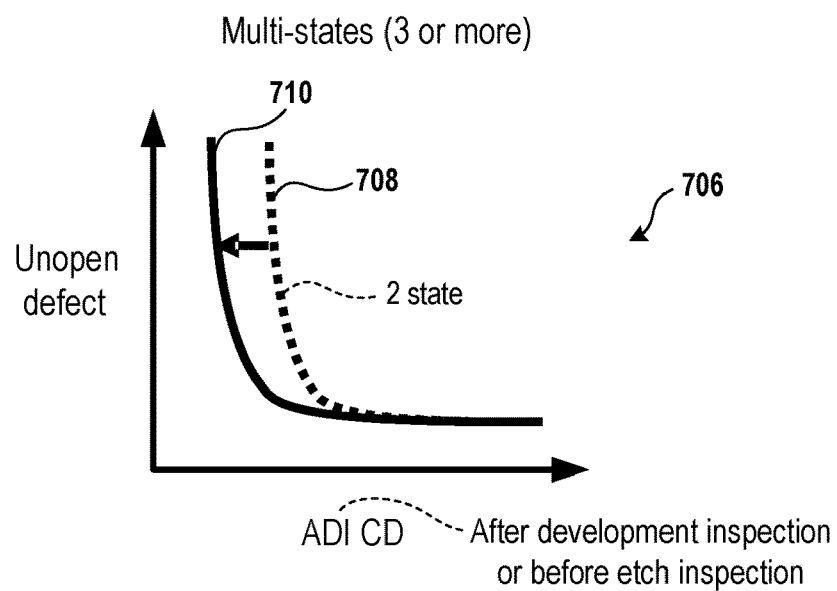
FIG. 7B is an embodiment of a graph to illustrate a plot of an unopen defect plotted on a y-axis versus an after development inspection (ADI) bow CD plotted on an x-axis.

FIG. 7B is an embodiment of a graph 706 to illustrate a plot 708 of an unopen defect plotted on a y-axis versus an after development inspection (ADI) bow CD plotted on an x-axis. The ADI inspection is an inspection that occurs before an etch operation is applied to the substrate S. The graph 706 also includes a plot 710. The plot 708 is generated when the two-state pulsing is applied and the plot 710 is generated when the multi-state pulsing is applied. As illustrated in the graph 706, the multi-state pulsing is applied, for the same amount of holes that reach the bottom of the substrate layer, there is a reduction in the critical dimension of the bow of the substrate layer before an etch operation is performed on the substrate S.

Figure 7C:
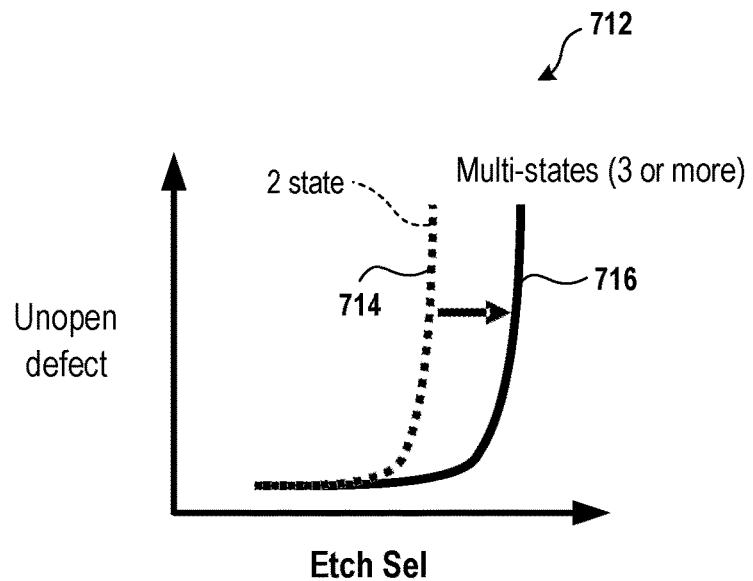
FIG. 7C is an embodiment of a graph to illustrate a plot of an unopen defect plotted on a y-axis versus etch selectivity (sel) plotted on an x-axis.

FIG. 7C is an embodiment of a graph 712 to illustrate a plot 714 of an unopen defect plotted on a y-axis versus etch selectivity (sel) plotted on an x-axis. The etch selectivity is a selectivity of the substrate layer compared to the mask layer. The graph 712 also includes a plot 716. The plot 714 is generated when the two-state pulsing is applied to the substrate S and the plot 716 is generated when the multi-state pulsing is applied to the substrate S. As illustrated in the graph 712, when the multi-state pulsing is applied, for the same amount of holes that reach the bottom of the substrate layer, there is an increase in the etch selectivity of the substrate layer.

Figure 7D:
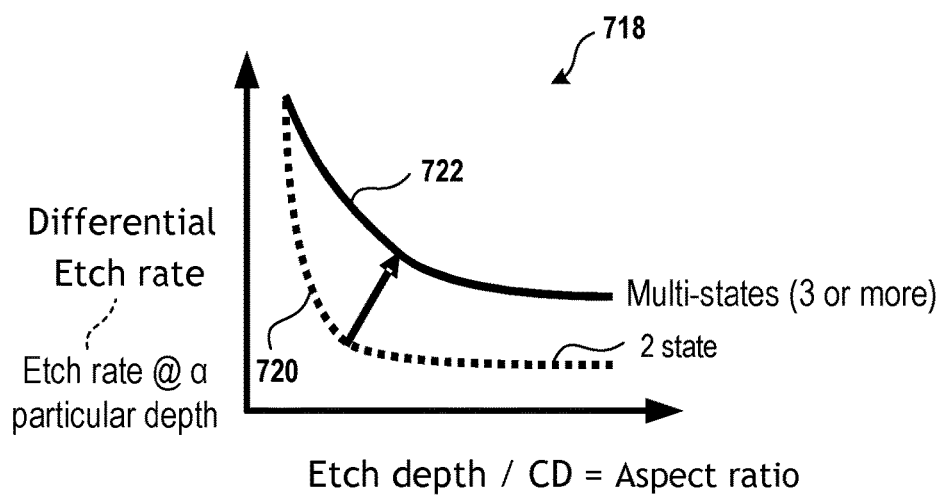
FIG. 7D is an embodiment of a graph to illustrate a plot of a differential etch rate plotted on a y-axis versus an aspect ratio.

FIG. 7D is an embodiment of a graph 718 to illustrate a plot 720 of a differential etch rate plotted on a y-axis versus an aspect ratio. The aspect ratio is a ratio of etch depth of etching the substrate layer and the critical dimension of the bow of the substrate layer. The aspect ratio is plotted on an x-axis. The differential etch rate is an etch rate of etching the substrate layer at a specific level of depth of the substrate layer. The graph 718 also includes a plot 722. The plot 720 is generated when the two-state pulsing is applied and the plot 722 is generated when the multi-state pulsing is applied. As illustrated in the graph 718, when the multi-state pulsing is applied, there is an increase in the aspect ratio for the same differential etch rate.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A system comprising:
a plasma chamber having a first electrode and a second electrode;
an impedance matching circuit coupled to the plasma chamber;
a bias radio frequency (RF) generator coupled to the impedance matching circuit, wherein the bias RF generator is configured to supply a bias radio frequency (RF) signal to the impedance matching circuit, wherein the bias RF signal includes a first plurality of parameter levels during a repeating time period, wherein the first plurality of parameter levels include a first parameter level during a first state, a second parameter level during a second state, and a third parameter level during a third state; and
a source RF generator coupled to the impedance matching circuit, wherein the source RF generator is configured to supply a source RF signal to the impedance matching circuit, wherein the source RF signal includes a second plurality of parameter levels during the repeating time period, wherein the second plurality of parameter levels include a first parameter level during the first state, a second parameter level during the second state, and a third parameter level during the third state,
wherein the first, second and third parameter levels of the bias RF signal are different from each other,
wherein the first, second and third parameter levels of the source RF signal are different from each other.

2. The system of claim 1, wherein the impedance matching circuit includes a bias impedance matching circuit and a source impedance matching circuit, wherein the source impedance matching circuit is configured to receive the source RF signal and provide an output to the first electrode, and wherein the bias impedance matching circuit is configured to receive the bias RF signal and provide an output to the second electrode.

3. The system of claim 2, wherein the first electrode is an upper electrode and the second electrode is a substrate support electrode.

4. The system of claim 1, wherein the impedance matching circuit is configured to provide an output based on the bias RF signal and the source RF signal.

5. The system of claim 4, wherein the output from the impedance matching circuit is provided to the first electrode.

6. The system of claim 5, wherein the first electrode is a substrate support electrode.

7. The system of claim 5, wherein the first electrode is an upper electrode.

8. The system of claim 1, wherein the source RF generator is configured to set the second parameter level of the source RF signal during the second state to be lower than the first parameter level of the source RF signal during the first state and higher than the third parameter level of the source RF signal during the third state, wherein the bias RF generator is configured to set the second parameter level of the bias RF signal during the second state to be lower than the first parameter level of the bias RF signal during the first state and higher than the third parameter level of the bias RF signal during the third state.

9. The system of claim 1, wherein the source RF generator is configured to set the third parameter level of the source RF signal during the third state to be lower than the first parameter level of the source RF signal during the first state and higher than the second parameter level of the source RF signal during the second state, wherein the bias RF generator is configured to set the third parameter level of the bias RF signal during the third state to be lower than the first parameter level of the bias RF signal during the first state and higher than the second parameter level of the bias RF signal during the second state.

10. The system of claim 1, wherein the source RF generator is configured to change a duration for which the second parameter level of the source RF signal is maintained during the second state, wherein the bias RF generator is configured to change a duration for which the second parameter level of the bias RF signal is maintained during the second state.

11. The system of claim 1, wherein the source RF generator is configured to change the second parameter level at which the source RF signal is maintained during the second state, and wherein the bias RF generator is configured to change the second parameter level at which the bias RF signal is maintained during the second state.

12. The system of claim 1, wherein during the first state, an etch operation is performed and during the third state, a deposition operation is performed.

* * * * *